United States Patent
Christiansen et al.

(10) Patent No.: US 10,575,437 B1
(45) Date of Patent: Feb. 25, 2020

(54) TEMPERATURE CONTROL METHOD, SYSTEM, AND APPARATUS

(71) Applicants: Martin Brokner Christiansen, Laurel, MD (US); Robert J. Voigt, Arnold, MD (US); Benjamin Chaoning Liu, Silver Spring, MD (US); Jonathan Francis Van Dyke, Baltimore, MD (US); Bruce Ryan Isler, Catonsville, MD (US)

(72) Inventors: Martin Brokner Christiansen, Laurel, MD (US); Robert J. Voigt, Arnold, MD (US); Benjamin Chaoning Liu, Silver Spring, MD (US); Jonathan Francis Van Dyke, Baltimore, MD (US); Bruce Ryan Isler, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/359,716

(22) Filed: Mar. 20, 2019

(51) Int. Cl.
*H05K 7/20* (2006.01)
*G06F 1/20* (2006.01)

(52) U.S. Cl.
CPC ......... *H05K 7/20236* (2013.01); *G06F 1/206* (2013.01); *H05K 7/20272* (2013.01);
(Continued)

(58) Field of Classification Search
CPC ................ H05K 7/20236; H05K 7/20281
See application file for complete search history.

(56) References Cited

U.S. PATENT DOCUMENTS 2,036,432 A  12/1933  Musante et al.
4,846,095 A   7/1989  Emslander
(Continued)

FOREIGN PATENT DOCUMENTS

DE   10138711 A1   4/2002
EP    2400828 A1  12/2011
(Continued)

OTHER PUBLICATIONS

Kawai, J et al.: "Fabrication of Superconducting Quantum Interference Device Magnetometers on a Glass Epoxy Polyimide Resin Substrate With Copper Terminals," Physics Procedia, NL, 2012, vol. 36, pp. 262-267.

(Continued)

*Primary Examiner* — Hung V Ngo
(74) *Attorney, Agent, or Firm* — Tarolli, Sundheim, Covell & Tummino LLP

(57) ABSTRACT

An apparatus for providing immersion cooling in a compact-format circuit card environment comprises a plurality of circuit cards, each including first and second subassemblies. Each of the subassemblies is surrounded in a longitudinal-lateral plane by a corresponding first or second perimeter frame. The first and second subassemblies have first and second operating temperatures, respectively. A first temperature tank is formed by first perimeter frames and substantially surrounds the first subassemblies. A second temperature tank is formed by second perimeter frames and substantially surrounds the second circuit card subassemblies. A first temperature cooling supply line selectively introduces the first cooling fluid into the first temperature tank for at least partially inducing the first operating temperature. A second temperature cooling supply line selectively introduces the second cooling fluid into the second (Continued)

temperature tank for at least partially inducing the second operating temperature.

24 Claims, 27 Drawing Sheets

(52) U.S. Cl.
CPC ..... *H05K 7/20281* (2013.01); *H05K 7/20372* (2013.01); *H05K 7/20781* (2013.01); *G06F 2200/201* (2013.01)

(56) References Cited

U.S. PATENT DOCUMENTS

| | | | |
|---|---|---|---|
| 4,962,444 | A | 10/1990 | Niggemann |
| 5,268,815 | A | 12/1993 | Cipolla et al. |
| 6,285,564 | B1 | 9/2001 | O' et al. |
| 6,616,469 | B2 | 9/2003 | Goodwin et al. |
| 6,713,854 | B1 | 3/2004 | Kledzik et al. |
| 6,957,623 | B2 | 10/2005 | Guisinger et al. |
| 7,190,060 | B1 | 3/2007 | Chiang |
| 7,432,790 | B2 | 10/2008 | Arndt et al. |
| 7,609,523 | B1 | 10/2009 | Ni et al. |
| 8,306,772 | B2 | 11/2012 | Cox et al. |
| 8,694,939 | B1 | 4/2014 | Frost et al. |
| 8,780,556 | B1 | 7/2014 | Ditri |
| 9,313,930 | B2 * | 4/2016 | Goth ................. H05K 7/20772 |
| 9,648,749 | B1 | 5/2017 | Christiansen |
| 9,681,533 | B2 | 6/2017 | Christiansen et al. |
| 9,992,914 | B2 * | 6/2018 | Best ................. H05K 7/20763 |
| 10,365,436 | B2 | 7/2019 | Byrd et al. |
| 2002/0187590 | A1 | 12/2002 | Bolken et al. |
| 2004/0041166 | A1 | 3/2004 | Morrison |
| 2005/0061541 | A1 | 3/2005 | Belady |
| 2008/0032456 | A1 | 2/2008 | Ahn et al. |
| 2008/0239683 | A1 | 10/2008 | Brodsky et al. |
| 2011/0075377 | A1 | 3/2011 | Paquette et al. |
| 2012/0140421 | A1 | 6/2012 | Kirstine |
| 2013/0333414 | A1 | 12/2013 | Inaba et al. |
| 2014/0268594 | A1 | 9/2014 | Wang et al. |
| 2015/0060009 | A1 * | 3/2015 | Shelnutt ................. F28F 27/02 165/11.1 |
| 2016/0073548 | A1 | 3/2016 | Wei et al. |
| 2017/0142820 | A1 | 5/2017 | Christiansen et al. |

FOREIGN PATENT DOCUMENTS

| | | |
|---|---|---|
| JP | 7-7188 A | 1/1995 |
| JP | 2007049015 A | 2/2007 |
| JP | 2010186846 A | 8/2010 |

OTHER PUBLICATIONS

Japanese Office Action corresponding to Japanese Application No. 2018-525559 dated Apr. 8, 2019.

Gubin, et al.: "Dependence of magnetic penetration depth on the thickness of superconducting Nb thin films"; found on the internet @ http://zb0035.zb.kfa-juelich.de/record/47039/files/74153.pdf; The American Physical Society, Physical Review B 72, 06453 (2005); pp. 1-8.

Locment, et al.: "DC Load and Batteries Control Limitations for Photovoltaic Systems. Experimental Validation"; found on the internet @ http://www.pgembeddedsystems.com/securelogin/upload/project/IEEE/15/PG2012PE1 /dcload_ and_ batteries_ control_ limitations for _photovoltaic_ systems_experimental_validation.pdf; IEEE Transactions on Power Electronics, vol. 27, No. 9, Sep. 2012, pp. 4030-4038.

Tolpygo, et al.: "Fabrication Process and Properties of Fully-Planarized Deep-Submicron Nb/Al—AlOx/Nb Josephson Junctions for VLSI Circuits"; found on the internet@ https://~rxiv.org/flp/arxiv/papers/1408/1408.5829.pdf;2EPo1A-02 DOI: 10.1109/TASC.2014.2374836; pp. 1-13.

Japanese Office Action corresponding to JP Patent No. 2018-525552, pp. 1-3, dated May 29, 2019.

International Search Report and Written Opinion corresponding to PCT/US2019/024366, pp. 1-15, dated Jul. 4, 2019.

Korean Office Action corresponding to Korean Patent Application No. 10-2018-7013967, pp. 1-6, dated Jun. 24, 2019.

International Search Report and Written Opinion corresponding to PCT/US2019/018766, pp. 1-16, dated May 22, 2019.

Iversen A Ed—institute of Electrical and Electronics Engineers: "Next Generation Power Electronics for Space and Aircraft. / Part II—Packaging", Aerospace Power Systems. Boston, Aug. 4-9, 1991; [Proceedings of the Intersociety Energy Conversion Engineering Conference], New York, IEEE, US, vol. 1, Aug. 4, 1991 (Aug. 4, 1991), pp. 177-182, XP000280446, ISBN: 978-0-89448-163-5, p. 179, col. 2, p. 181, cols. 1-2, figures 6-8.

International Search Report and Written Opinion for PCT/US2019/024857 dated Jul. 22, 2019.

* cited by examiner

```
27104 ─┐  PROVIDING AN APPARATUS INCLUDING A PLURALITY OF CIRCUIT CARDS,
         EACH CIRCUIT CARD INCLUDING FIRST AND SECOND LONGITUDINALLY
         SPACED CIRCUIT CARD SUBASSEMBLIES, EACH OF THE FIRST AND SECOND
         CIRCUIT CARD SUBASSEMBLIES BEING SURROUNDED IN A
         LONGITUDINAL-LATERAL PLANE BY A CORRESPONDING FIRST OR SECOND
         PERIMETER FRAME, THE FIRST AND SECOND CIRCUIT CARD SUBASSEMBLIES
         BEING CONNECTED TOGETHER BY A LONGITUDINALLY EXTENDING CARD
         CONNECTOR, THE FIRST AND SECOND CIRCUIT CARD SUBASSEMBLIES
         HAVING FIRST AND SECOND OPERATING TEMPERATURES, RESPECTIVELY,
         THE FIRST AND SECOND OPERATING TEMPERATURES BEING DIFFERENT
         FROM ONE ANOTHER, A FIRST TEMPERATURE TANK COLLECTIVELY FORMED
         BY AT LEAST A PLURALITY OF FIRST PERIMETER FRAMES ARRANGED IN A
         TRANSVERSELY EXTENDING STACK, THE FIRST TEMPERATURE TANK
         SUBSTANTIALLY SURROUNDING THE PLURALITY OF FIRST CIRCUIT CARD
         SUBASSEMBLIES, A SECOND TEMPERATURE TANK COLLECTIVELY FORMED BY
         AT LEAST A PLURALITY OF SECOND PERIMETER FRAMES ARRANGED IN A
         TRANSVERSELY EXTENDING STACK, THE SECOND TEMPERATURE TANK
         SUBSTANTIALLY SURROUNDING THE PLURALITY OF SECOND CIRCUIT CARD
         SUBASSEMBLIES, AT LEAST ONE FIRST TEMPERATURE COOLING MANIFOLD
         BEING IN SELECTIVE FLUID COMMUNICATION WITH THE FIRST
         TEMPERATURE TANK, AND AT LEAST ONE SECOND TEMPERATURE COOLING
         MANIFOLD BEING IN SELECTIVE FLUID COMMUNICATION WITH THE SECOND
         TEMPERATURE TANK

27106 ─┐  AT LEAST PARTIALLY EXPOSING THE FIRST CIRCUIT CARD SUBASSEMBLIES
         TO THE FIRST OPERATING TEMPERATURE VIA PLACING AT LEAST ONE
         FIRST TEMPERATURE COOLING MANIFOLD IN SELECTIVE FLUID
         COMMUNICATION WITH AN INTERIOR OF THE FIRST TEMPERATURE TANK

27108 ─┐  SELECTIVELY INTRODUCING A FIRST COOLING FLUID INTO, AND
         SELECTIVELY REMOVING THE FIRST COOLING FLUID FROM, THE FIRST
         TEMPERATURE TANK

27110 ─┐  CONVECTIVELY CIRCULATING THE FIRST COOLING FLUID AROUND THE
         PLURALITY OF FIRST CIRCUIT CARD SUBASSEMBLIES WITHIN THE FIRST
         TEMPERATURE TANK TO AT LEAST PARTIALLY INDUCE THE FIRST
         OPERATING TEMPERATURE

27112 ─┐  AT LEAST PARTIALLY EXPOSING THE SECOND CIRCUIT CARD SUBASSEMBLIES
         TO THE SECOND OPERATING TEMPERATURE VIA PLACING AT LEAST ONE
         SECOND TEMPERATURE COOLING MANIFOLD IN SELECTIVE FLUID
         COMMUNICATION WITH AN INTERIOR OF THE SECOND TEMPERATURE TANK

27114 ─┐  SELECTIVELY INTRODUCING A SECOND COOLING FLUID INTO, AND
         SELECTIVELY REMOVING THE SECOND COOLING FLUID FROM, THE
         SECOND TEMPERATURE TANK

27116 ─┐  CONVECTIVELY CIRCULATING THE SECOND COOLING FLUID AROUND
         THE PLURALITY OF SECOND CIRCUIT CARD SUBASSEMBLIES WITHIN
         THE SECOND TEMPERATURE TANK TO AT LEAST PARTIALLY INDUCE
         THE SECOND OPERATING TEMPERATURE
```

FIG. 27

TEMPERATURE CONTROL METHOD, SYSTEM, AND APPARATUS

TECHNICAL FIELD

This disclosure relates to a temperature control method, system, and apparatus and, more particularly, to an apparatus, system, and method for providing immersion cooling in a compact-format circuit card environment.

BACKGROUND

A circuit card is the current state of the art for building assemblies of electronic devices including a plurality of integrated circuits ("chips"). These assemblies can be separated into multiple types: organic multilayer laminated printed wire board (PWB), low temperature co-fired ceramic (LTCC), and high temperature co-fired ceramic (HTCC). Using each of these technologies, circuit card assemblies have been fabricated.

In a superconducting supercomputer, many of the operating processing integrated circuits ("chips") are cooled to about 4K, but certain of the memory chips instead have a much warmer operating temperature of about 77K. Providing cooling at 4K is a costly activity, so every effort is made in superconducting supercomputer design to reduce the thermal parasitic load. This includes placing the assembly in vacuum (no convection), use of coatings and multilayer insulation to reduce radiation, and limiting the conductive thermal load between the "hot side" and "cool side" of the entire assembly.

For large scale applications, the state of the art currently solves the problem of achieving the desired operating temperatures for a superconducting supercomputer while avoiding thermal parasitic load by using dewars for each of the cryogenic temperatures. A 4K dewar is maintained with liquid helium and a 77K dewar uses liquid nitrogen. Signals between the two temperature sides are completed by cabling. This solution requires cables that are long from a digital perspective, which results in significant latency between the 4K and 77K regions and would require more parts in the 4K stage, such as, but not limited to, amplifiers to compensate for the loss in the longer signal path. These additional parts consume significant power and make certain designs of superconducting supercomputers infeasible.

In small scale applications, a cryocooler can be used for both temperatures. The intermediate stage of the cryocooler provides a 77K platform while the final stage of the cryocooler provides a 4K stage. Connections between the two zones are completed by cabling. While this brings the two temperatures sides closer together, this approach is not scalable to large applications.

Additionally, neither of the above strategies is particularly suited to a compact-format use environment, such as providing computing resources in a flexible and portable manner, due to the significant space and equipment needed.

SUMMARY

In an example, an apparatus for providing immersion cooling in a compact-format circuit card environment is described. The apparatus comprises a plurality of circuit cards. Each circuit card includes first and second longitudinally spaced circuit card subassemblies. Each of the first and second circuit card subassemblies is surrounded in a longitudinal-lateral plane by a corresponding first or second perimeter frame. The first and second circuit card subassemblies are connected together by a longitudinally extending card connector. The first and second circuit card subassemblies have first and second operating temperatures, respectively. The first and second operating temperatures are different from one another. A first temperature tank is collectively formed by at least a plurality of first perimeter frames arranged in a transversely extending stack. The first temperature tank substantially surrounds the plurality of first circuit card subassemblies. The first temperature tank selectively contains a first cooling fluid for convective circulation around the plurality of first circuit card subassemblies. A second temperature tank is collectively formed by at least a plurality of second perimeter frames arranged in a transversely extending stack. The second temperature tank substantially surrounds the plurality of second circuit card subassemblies. The second temperature tank selectively contains a second cooling fluid for convective circulation around the plurality of second circuit card subassemblies. At least one first temperature cooling supply line is in selective fluid communication with the first temperature tank. The first temperature cooling supply line selectively introduces the first cooling fluid into the first temperature tank for at least partially inducing the first operating temperature. At least one second temperature cooling supply line is in selective fluid communication with the second temperature tank. The second temperature cooling supply line selectively introduces the second cooling fluid into the second temperature tank for at least partially inducing the second operating temperature. At least one first temperature cooling return manifold is in selective fluid communication with the first temperature tank. The first temperature cooling return manifold selectively removes the first cooling fluid from the first temperature tank for at least partially inducing the first operating temperature. At least one second temperature cooling return manifold is in selective fluid communication with the second temperature tank. The second temperature cooling return manifold selectively removes the second cooling fluid from the second temperature tank for at least partially inducing the second operating temperature.

In an example, a method of providing immersion cooling in a compact-format circuit card environment is described. An apparatus is provided, the apparatus including a plurality of circuit cards. Each circuit card includes first and second longitudinally spaced circuit card subassemblies. Each of the first and second circuit card subassemblies is surrounded in a longitudinal-lateral plane by a corresponding first or second perimeter frame. The first and second circuit card subassemblies are connected together by a longitudinally extending card connector. The first and second circuit card subassemblies have first and second operating temperatures, respectively. The first and second operating temperatures are different from one another. A first temperature tank is collectively formed by at least a plurality of first perimeter frames arranged in a transversely extending stack. The first temperature tank substantially surrounds the plurality of first circuit card subassemblies. A second temperature tank is collectively formed by at least a plurality of second perimeter frames arranged in a transversely extending stack. The second temperature tank substantially surrounds the plurality of second circuit card subassemblies. At least one first temperature cooling supply line is in selective fluid communication with the first temperature tank. At least one second temperature cooling supply line is in selective fluid communication with the second temperature tank. The first circuit card subassemblies are at least partially exposed to the first operating temperature via placing at least one first temperature cooling supply line in selective fluid communication with an interior of the first temperature tank. A first cooling fluid is selectively introduced into, and selectively removed from, the first temperature tank. The first cooling fluid is convectively circulated around the plurality of first circuit card subassemblies within the first temperature tank to at least partially induce the first operating temperature. The second circuit card subassemblies are at least partially exposed to the second operating temperature via placing at least one second temperature cooling supply line in selective fluid communication with an interior of the second temperature tank. A second cooling fluid is selectively introduced into, and selectively removed from, the second temperature tank. The second cooling fluid is convectively circulated around the plurality of second circuit card subassemblies within the second temperature tank to at least partially induce the second operating temperature.

In an example, a system for providing immersion cooling in a compact-format circuit card environment is described. The system comprises an apparatus including a plurality of circuit cards. Each circuit card includes first and second longitudinally spaced circuit card subassemblies. Each of the first and second circuit card subassemblies is surrounded in a longitudinal-lateral plane by a corresponding first or second perimeter frame. The first and second circuit card subassemblies are connected together by a longitudinally extending card connector. The first and second circuit card subassemblies have first and second operating temperatures, respectively. The first and second operating temperatures are different from one another. A first temperature tank is collectively formed by at least a plurality of first perimeter frames arranged in a transversely extending stack. The first temperature tank substantially surrounds the plurality of first circuit card subassemblies. The first temperature tank selectively contains a first cooling fluid for convective circulation around the plurality of first circuit card subassemblies. A second temperature tank is collectively formed by at least a plurality of second perimeter frames arranged in a transversely extending stack. The second temperature tank substantially surrounds the plurality of second circuit card subassemblies. The second temperature tank selectively contains a second cooling fluid for convective circulation around the plurality of second circuit card subassemblies. At least one first temperature cooling supply line is in selective fluid communication with the first temperature tank. The first temperature cooling supply line selectively introduces the first cooling fluid into the first temperature tank for at least partially inducing the first operating temperature. At least one second temperature cooling supply line is in selective fluid communication with the second temperature tank. The second temperature cooling supply line selectively introduces the second cooling fluid into the second temperature tank for at least partially inducing the second operating temperature. At least one first temperature cooling return manifold is in selective fluid communication with the first temperature tank. The first temperature cooling return manifold selectively removes the first cooling fluid from the first temperature tank for at least partially inducing the first operating temperature. At least one second temperature cooling return manifold is in selective fluid communication with the second temperature tank. The second temperature cooling return manifold selectively removes the second cooling fluid from the second temperature tank for at least partially inducing the second operating temperature. A first cooling fluid source is in fluid supplying communication with the first temperature tank via the first temperature cooling supply line. A second cooling fluid source is in fluid supplying communication with the second temperature tank via the second temperature cooling supply line. A first cooling fluid destination is in fluid removing communication with the first temperature tank via the first temperature cooling return manifold. A second cooling fluid destination is in fluid removing communication with the second temperature tank via the second temperature cooling return manifold. A cabinet supports and at least partially encloses the apparatus, the first and second cooling fluid sources, and the first and second cooling fluid destinations.

BRIEF DESCRIPTION OF THE DRAWINGS

For a better understanding, reference may be made to the accompanying drawings, in which:

FIG. 27 is a flowchart depicting an example sequence of use of the example implementation of FIG. 1.

DESCRIPTION OF ASPECTS OF THE DISCLOSURE

This technology comprises, consists of, or consists essentially of the following features, in any combination.

Figure 1:
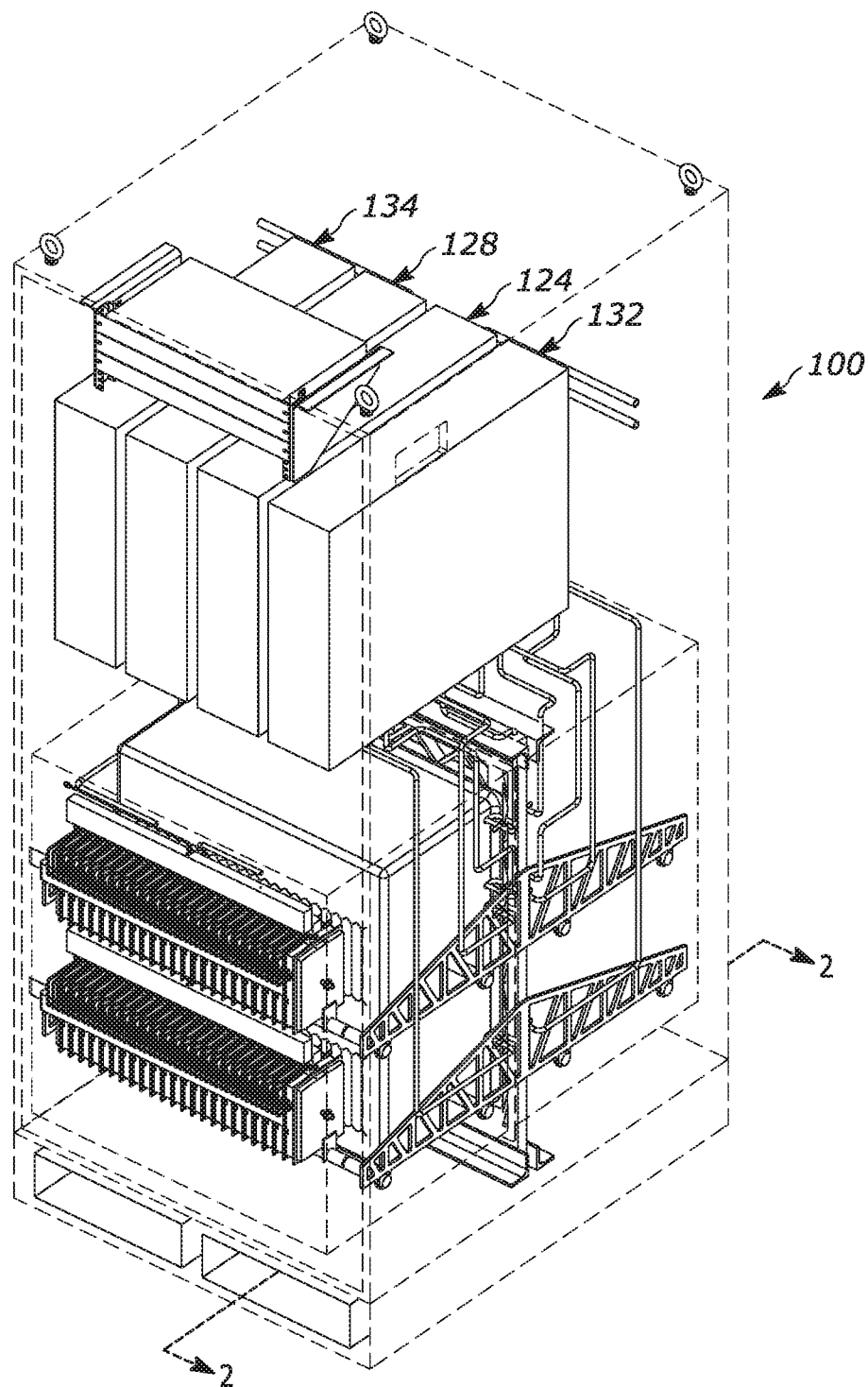
FIG. 1 is a schematic front perspective view of one example implementation of the invention.

FIG. 1 depicts an apparatus 100 for providing immersion cooling in a compact-format circuit card environment. As shown in more detail in FIG. 2, the apparatus 100 includes a plurality of circuit cards 202. Each circuit card 202 includes first and second longitudinally spaced circuit card subassemblies 204 and 206, respectively. Each of the first and second circuit card subassemblies 204 and 206 is surrounded in a longitudinal-lateral plane by a corresponding first or second perimeter frame 208 and 210, respectively, as will be discussed in more detail with reference to FIG. 8. The "longitudinal" direction is substantially parallel to line "Lo", and the "lateral" direction is substantially parallel to arrow "La" in FIG. 2, thus making the lateral-longitudinal plane (which contains both line Lo and line La) slightly canted from the plane of the page, as shown. One of ordinary skill in the art will be able to carry this orientation scheme through the remaining Figures. The first and second circuit card subassemblies 204 and 206 are connected together by a longitudinally extending card connector 212, for transmission of electrical power and/or signals therebetween.

Figure 2:
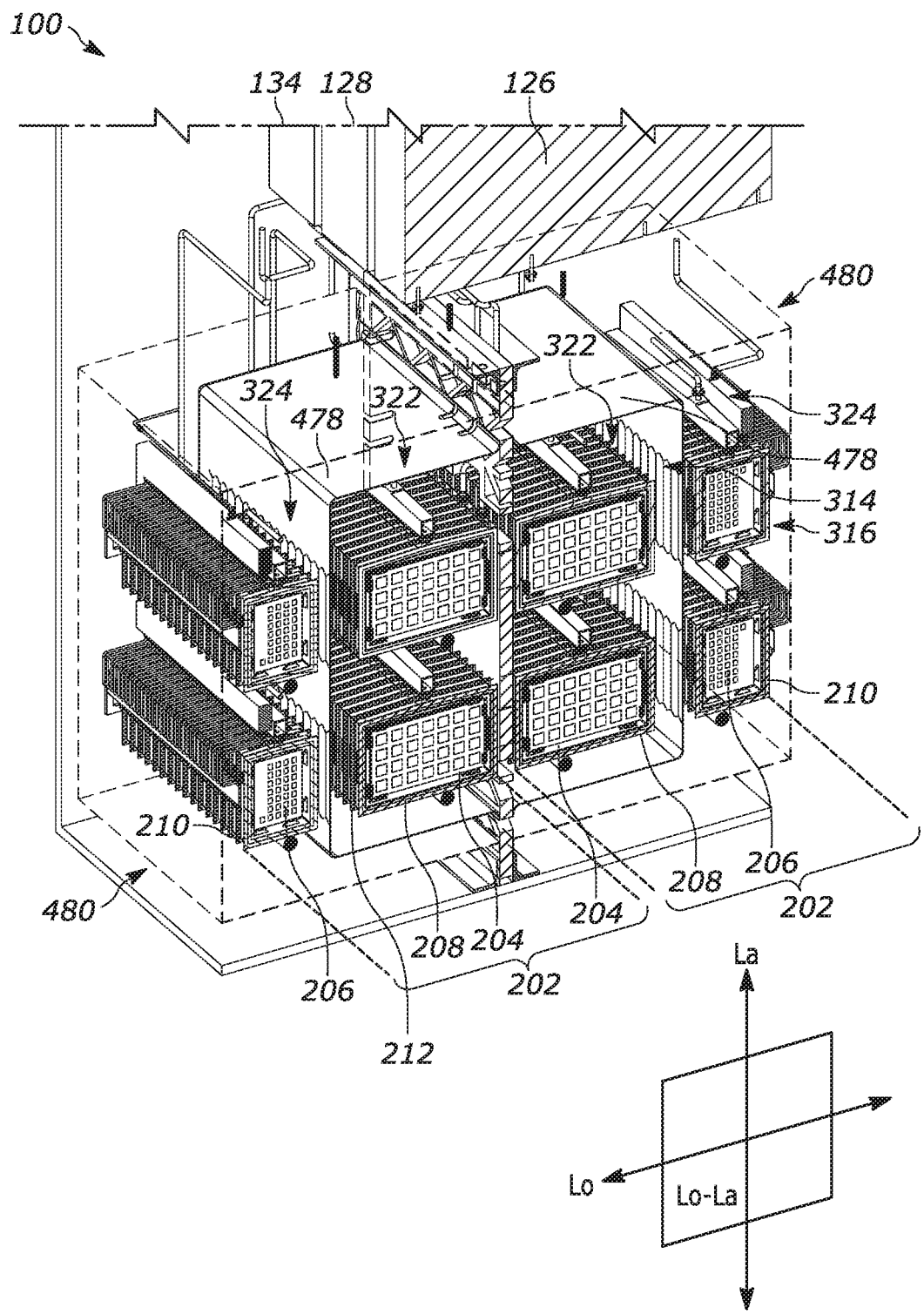
FIG. 2 is a partial cross-sectional view taken along line 2-2 of FIG. 1.
Figure 3:
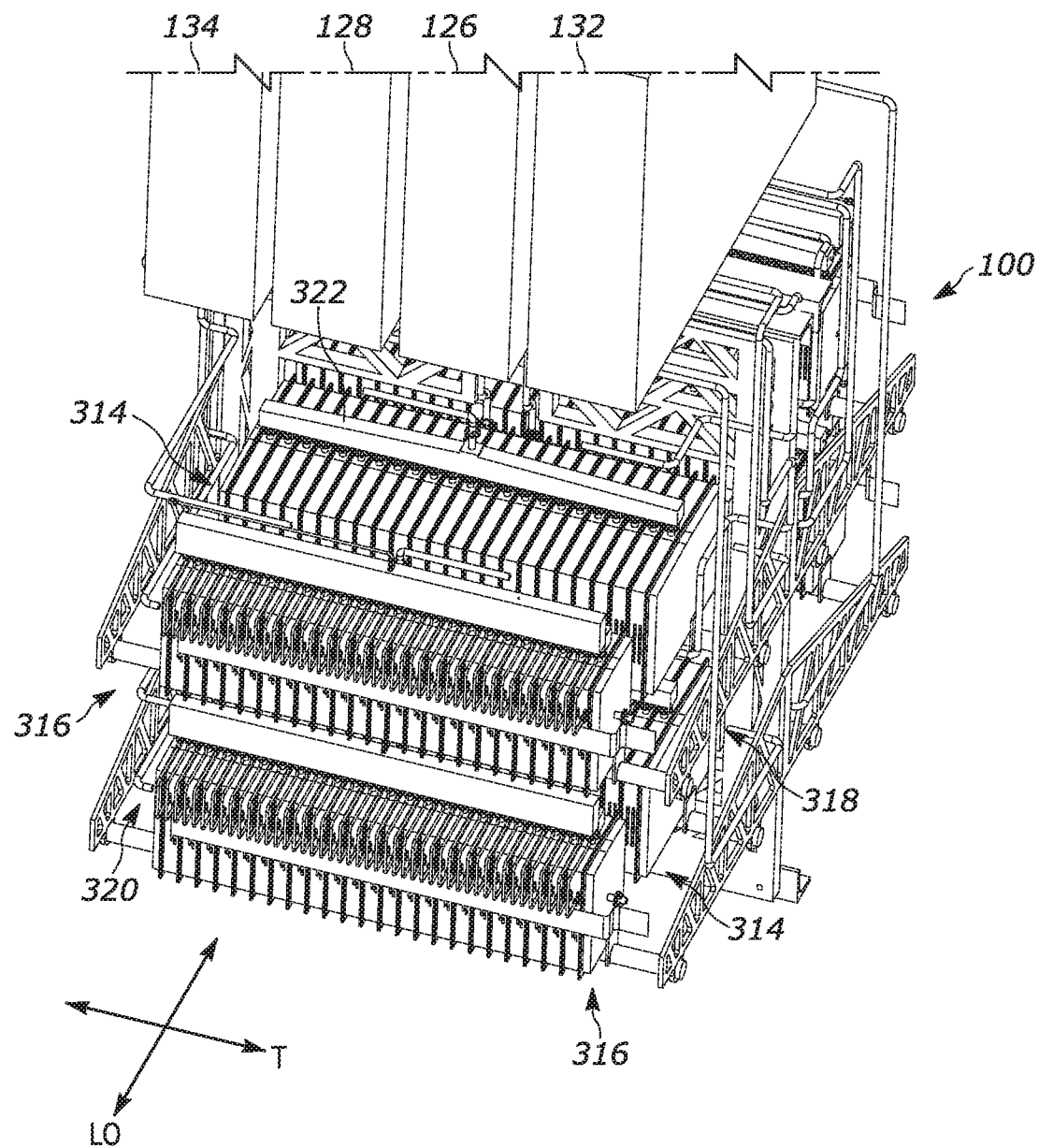
FIG. 3 is a schematic partial front perspective view of the example implementation of FIG. 1.

With reference now to FIGS. 1-3, the first temperature tank 314 is collectively formed by at least a plurality of first perimeter frames 208 arranged in a transversely extending stack, as will be discussed below with reference to FIGS. 7-8. The "transverse" direction, as referenced herein, is substantially parallel to transverse line T in FIG. 3, and is substantially perpendicular to the longitudinal-lateral plane. The first temperature tank 314 substantially surrounds the plurality of first circuit card subassemblies 204. The first temperature tank 314 selectively contains a first cooling fluid for convective circulation around the plurality of first circuit card subassemblies 204. Similarly, the second temperature tank 316 is collectively formed by at least a plurality of second perimeter frames 210 arranged in a transversely extending stack. The second temperature tank 316 substantially surrounds the plurality of second circuit card subassemblies 206. The second temperature tank 316 selectively contains a second cooling fluid for convective circulation around the plurality of second circuit card subassemblies 206. Each of the plurality of circuit cards 202 may be transversely positioned with respect to one or more adjacent circuit cards 202, with the first and second perimeter frames 208 and 210 of those circuit cards 202 cooperatively forming the first and second temperature tanks 314 and 316, as depicted in the Figures and described herein.

The first and second circuit card subassemblies 204 and 206 have first and second operating temperatures, respectively. The first and second operating temperatures are different from one another. One example way in which the first and second operating temperatures can be induced upon the first and second circuit card subassemblies 204 and 206 is that at least one first temperature cooling supply line 318 (shown in FIG. 3) is in selective fluid communication with the first temperature tank 314. The first temperature cooling supply line 318 selectively introduces the first cooling fluid into the first temperature tank 314 for at least partially inducing the first operating temperature. Similarly, at least one second temperature cooling supply line 320 may be in selective fluid communication with the second temperature tank 316. The second temperature cooling supply line 320 selectively introduces the second cooling fluid into the second temperature tank 316 for at least partially inducing the second operating temperature. At least one first temperature cooling return manifold 322 is in selective fluid communication with the first temperature tank 314. The first temperature cooling return manifold 322 selectively removes the first cooling fluid from the first temperature tank 314 for at least partially inducing the first operating temperature. At least one second temperature cooling return manifold 324 is in selective fluid communication with the second temperature tank 316. The second temperature cooling return manifold 324 selectively removes the second cooling fluid from the second temperature tank 316 for at least partially inducing the second operating temperature.

Figure 5:
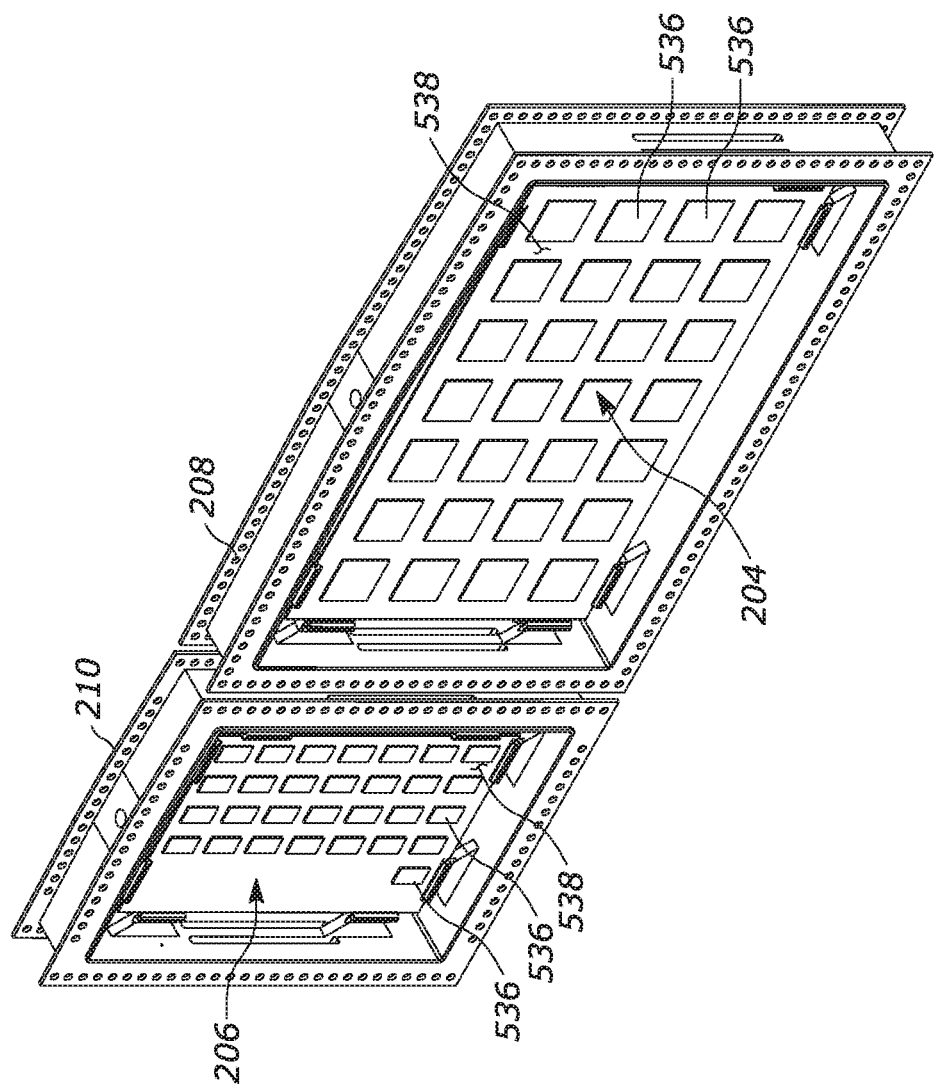
FIG. 5 is a schematic perspective view of a component of the example implementation of FIG. 1.

Stated differently, two longitudinally adjacent first and second circuit card subassemblies 204 and 206—such as those shown in FIG. 5—can be maintained (via their inclusion in the apparatus 100) in close spatial proximity to each other, each at a different temperature, with low thermal parasitic heat transfer between the first and second circuit card subassemblies 204 and 206 due, at least in part, to at least one of the cooling structures described herein.

Figure 6:
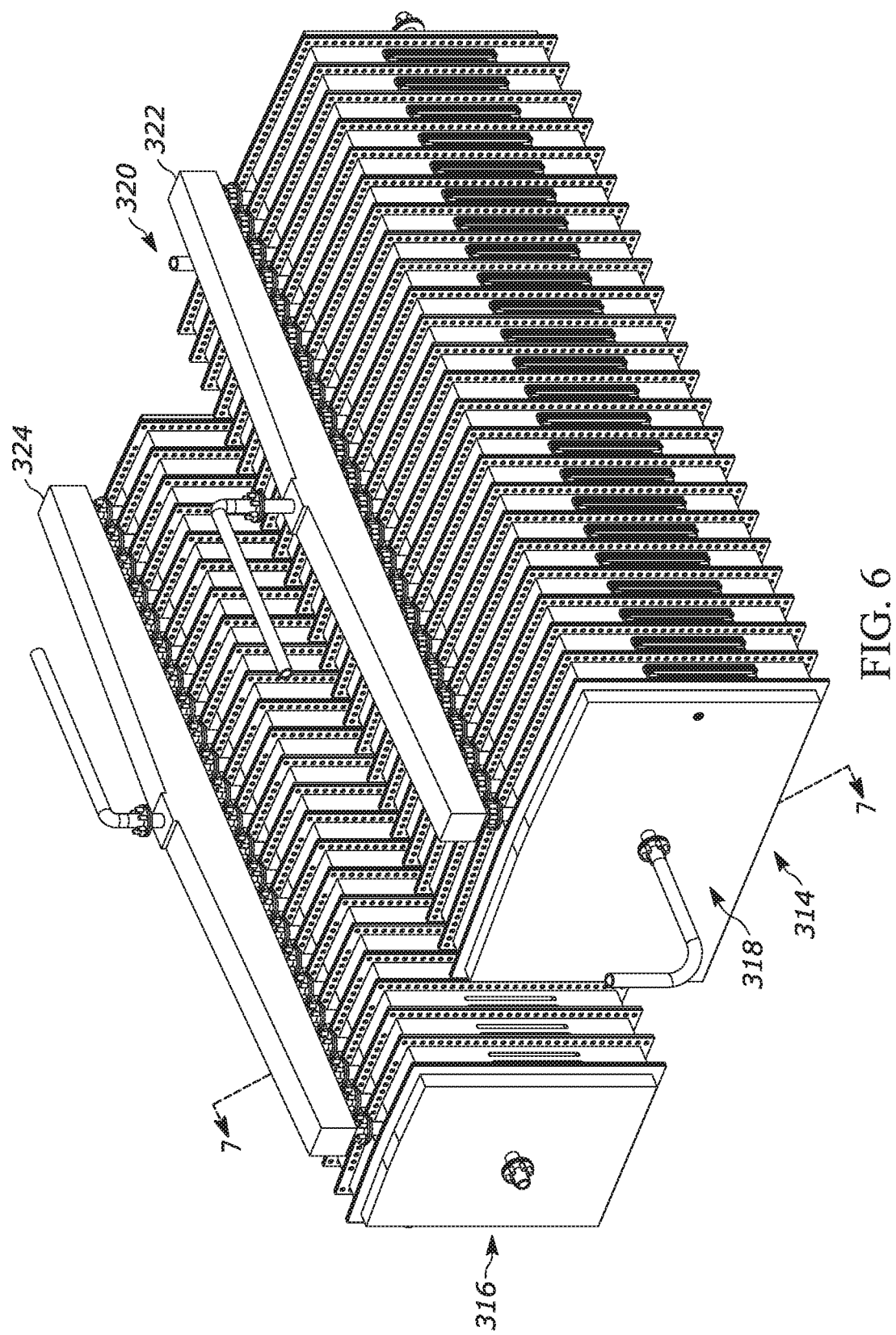
FIG. 6 is a schematic partial side perspective view of the example implementation of FIG. 1.

At least one first temperature cooling supply line 318, shown at least in FIGS. 3 and 6, is in selective fluid communication with the first temperature tank 314. The first temperature cooling supply line 318 selectively introduces the first cooling fluid into the first temperature tank 314 for at least partially inducing the first operating temperature. At least one second temperature cooling supply line 320 is in selective fluid communication with the second temperature tank 316. The second temperature cooling supply line 320 selectively introduces the second cooling fluid into the second temperature tank 316 for at least partially inducing the second operating temperature.

With reference again to FIGS. 1 and 3-4, the cooling fluid(s) can be supplied to, and removed from, the apparatus 100 in any desired manner. For example, a first cooling fluid source 126 (e.g., a "cool side" Dewar of liquid helium, at about 4 K) may be in fluid supplying communication with the first temperature cooling supply line 318. A second cooling fluid source 128 (e.g., a "hot side" Dewar of liquid nitrogen, at about 77 K) is in fluid supplying communication with the second temperature cooling supply line 434. The apparatus 100 may include a plurality of manifold interfaces (shown at 730 in FIG. 7), each manifold interface 730 being in fluid communication with a selected one of the first and second temperature tanks 314 and 316. When present, each manifold interface 730 may be configured for selective fluid communication with a tank interior of the selected first or second temperature tank 314. For example, the first temperature cooling supply line 318 may be in fluid communication via the at least one manifold interface 730 with the tank interior of the first temperature tank 314. The second temperature cooling supply line 320 may be in fluid communication via the at least one manifold interface 730 with the tank interior of the second temperature tank 316. The manifold interfaces 730 (a plurality of which may be provided to each of the first and second temperature tanks 314 and 316) may provide unidirectional (supply or return only) or bidirectional (supply and return both) fluid communication between each of the first and second temperature cooling supply lines 318 and 320 and the corresponding first or second temperature tank 314 and 316 via at least one corresponding manifold interface 730.

Though the cryogenic fluids described herein could be compressed on board an airplane or other limited-space environment, it is contemplated that, for most use environments of the system 100, compressed cryogenic liquids could be provided, for example, using the infrastructure accommodations for gas liquefaction which are commonly available at aircraft or computing facilities. (An aircraft is used here as just one example of a suitable use environment for the apparatus 100. A data center or mobile vehicle are other examples, among many, of suitable use environments.) As a result of use of the system 100 and the first and second cooling fluid sources 126 and 128 (which store previously compressed cryogenic liquids), weight and power consumption on board the aircraft or other limited environment can be reduced from that which otherwise would be needed to initially produce/compress cryogenic liquids on board or onsite. It is believed that first and second cooling fluid sources 126 and 128 having capacities and form factors well within the capabilities of current aircraft accommodations, for example, could support cryogenic cooling for supercomputer usage of even extremely lengthy airplane flights (e.g., a 12-hour flight using commercial dewars, a 24-hour flight using dewars which are custom-shaped for the cabinet, or any other desired flight time via provision of appropriate amounts and types of cooling fluid(s)), through use of the system 100.

Once the cooling fluid(s) have been passed through the apparatus 100 as described, they will normally be in a largely vapor phase and could be considered "waste" products. Therefore, the system 100 may include a first cooling fluid destination 132 in fluid removing communication with the first temperature tank 314, for example via the first temperature cooling return manifold 322 and/or via a bidirectional manifold interface 730. For example, when the first cooling fluid is liquid and/or vapor helium, the helium may be re-compressed as/if desired and stored as a compressed gas at ambient temperature. If it is not stored, the helium gas could be vented to an ambient space as the first cooling fluid destination, but helium gas has some value and would likely be recaptured.

A second cooling fluid destination 134 is in fluid removing communication with the second temperature tank 316 via the second temperature cooling return manifold 324 and/or via a bidirectional manifold interface 730. For example, when the second cooling fluid is liquid and/or vapor nitrogen, this fluid has little value, and could be vented into an ambient space as the second cooling fluid destination. However, the nitrogen could be re-compressed as/if desired and stored in much the same way as mentioned above for helium.

Because of uncertainty as to the ultimate desired nature of the first and second cooling fluid destinations 132 and 134, it is presumed that whatever component within the system 100 is connected to the first and second temperature cooling return manifolds 322 and 324, respectively, is considered as a first or second cooling fluid destination 132 and 134, even if the "waste" or "spent" cooling fluid is ultimately routed outside the apparatus 100 for further processing and/or to be employed in other cooling applications in nearby equipment, for maximum utility. One of ordinary skill in the cryogenics arts will be able to provide suitable cooling fluid flow paths, supplies, and piping for a particular use environment of aspects of the present invention.

FIGS. 5-9 depict the circuit cards 202 and first and second perimeter frames 208 and 210 in detail. As shown in FIG. 5, each circuit card subassembly 204 and 206 includes a plurality of IC chips 536 extending transversely from a single backing substrate 538. The IC chips 536 of a single circuit card 202 may have different temperature requirements. For example, the longitudinally rightmost (in the orientation of FIGS. 5 and 8) array of IC chips 536 (e.g., those on the first circuit card subassembly 204) could have a desired operating temperature in the range of about 2-6K, such as about 4K. Similarly, the longitudinally leftmost (in the orientation of FIGS. 5 and 8) array of IC chips 536 (e.g., those on the second circuit card subassembly 206) could have a desired operating temperature in the range of about 75-79K, such as about 77K.

As described herein, the apparatus 100 can help provide a desired temperature-differential environment for the first and second circuit card subassemblies 204 and 206. Having greater physical separation between the first and second circuit card subassemblies 204 and 206 desirably increases the thermal isolation; however, it also increases the signal loss and latency. A balance should be struck, by one of ordinary skill in the art, between acceptable signal loss/latency and thermal isolation to determine the optimal separation, and signal-transfer and thermal-isolation features of the apparatus 100, for a particular use environment. For example, and as shown in FIG. 8, the card connector 212 includes a flexible interconnect 840 extending longitudinally between the first and second circuit card subassemblies 204 and 206 of a selected circuit card 202.

Figure 7:
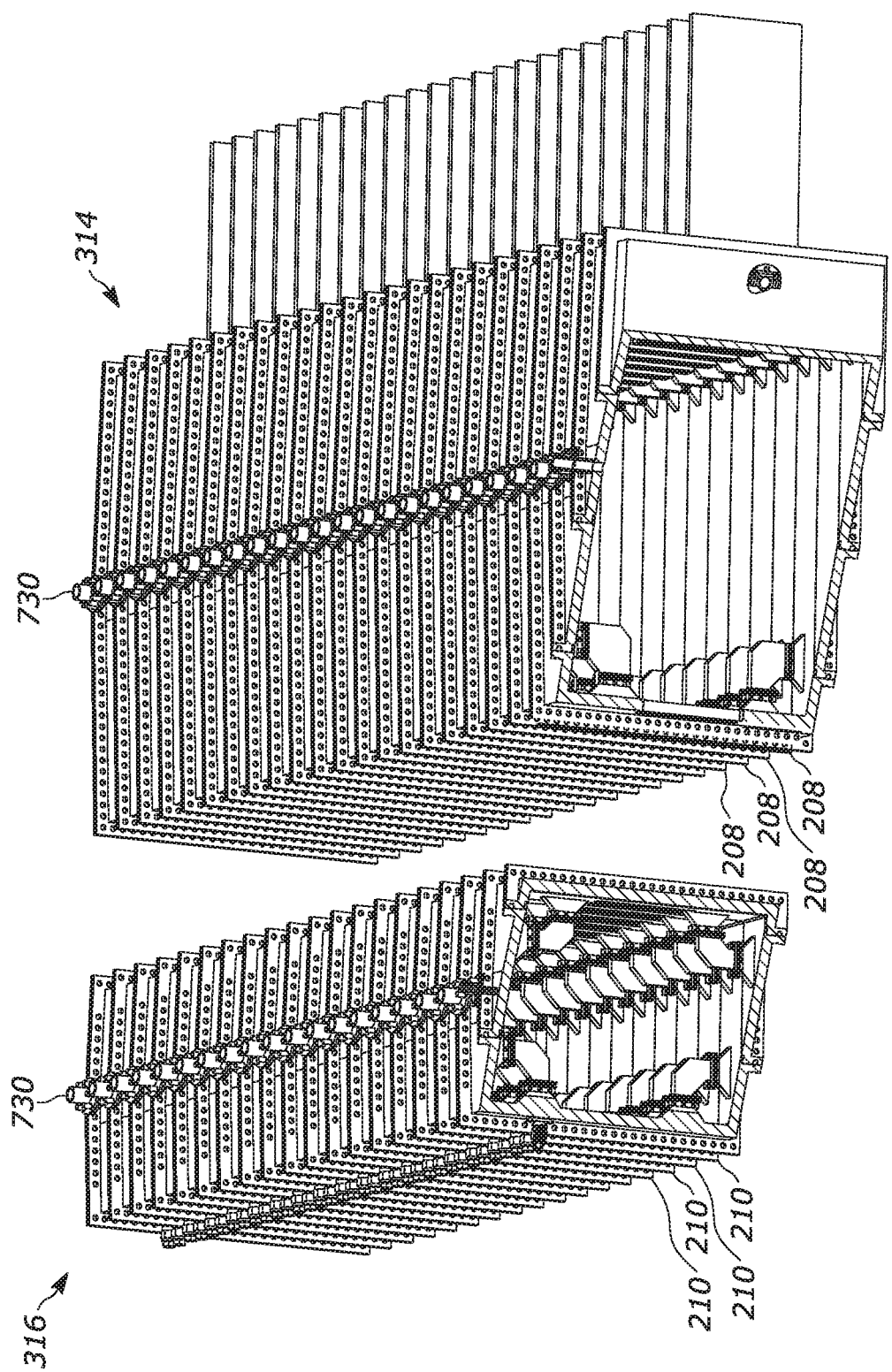
FIG. 7 is a partial cross-sectional view taken along line 7-7 of FIG. 6.

FIG. 6, and the corresponding partial cross-sectional view of FIG. 7, depict in detail the construction of the first and second temperature tanks 314 and 316. As is readily apparent from at least FIG. 7, the first and second temperature tanks 314 and 316 are formed in a laminated or "stacked" manner, with a plurality of first and second perimeter frames 208 and 210 being attached together to enclose an internal volume within which the cooling fluid can contact, flow over, and even bathe the respective first and second circuit card subassemblies 204 and 206 and thus remove heat from the IC chips 536.

In order to assist with providing a substantially fluidtight aspect to the first and second temperature tanks 314 and 316, at least two adjacent first or second perimeter frames 208 or 210 collectively forming a selected one of the first and second temperature tanks 314 and 316 may include a gasket (shown schematically at "G" in FIG. 8) interposed transversely therebetween. The gasket G may be at least partly made of indium, to assist with the sealing process. Indium is used here as an example, since it remains compliant at very low temperatures (e.g., 4K), and indium gaskets of various types are already commercially available. The first and second temperature tanks 314 and 316 may also or instead be lined with, and/or enclosed within, a substantially fluidtight structure to assist with maintaining the first and second cooling fluids within the first and second temperature tanks 314 and 316 as desired.

Figure 8:
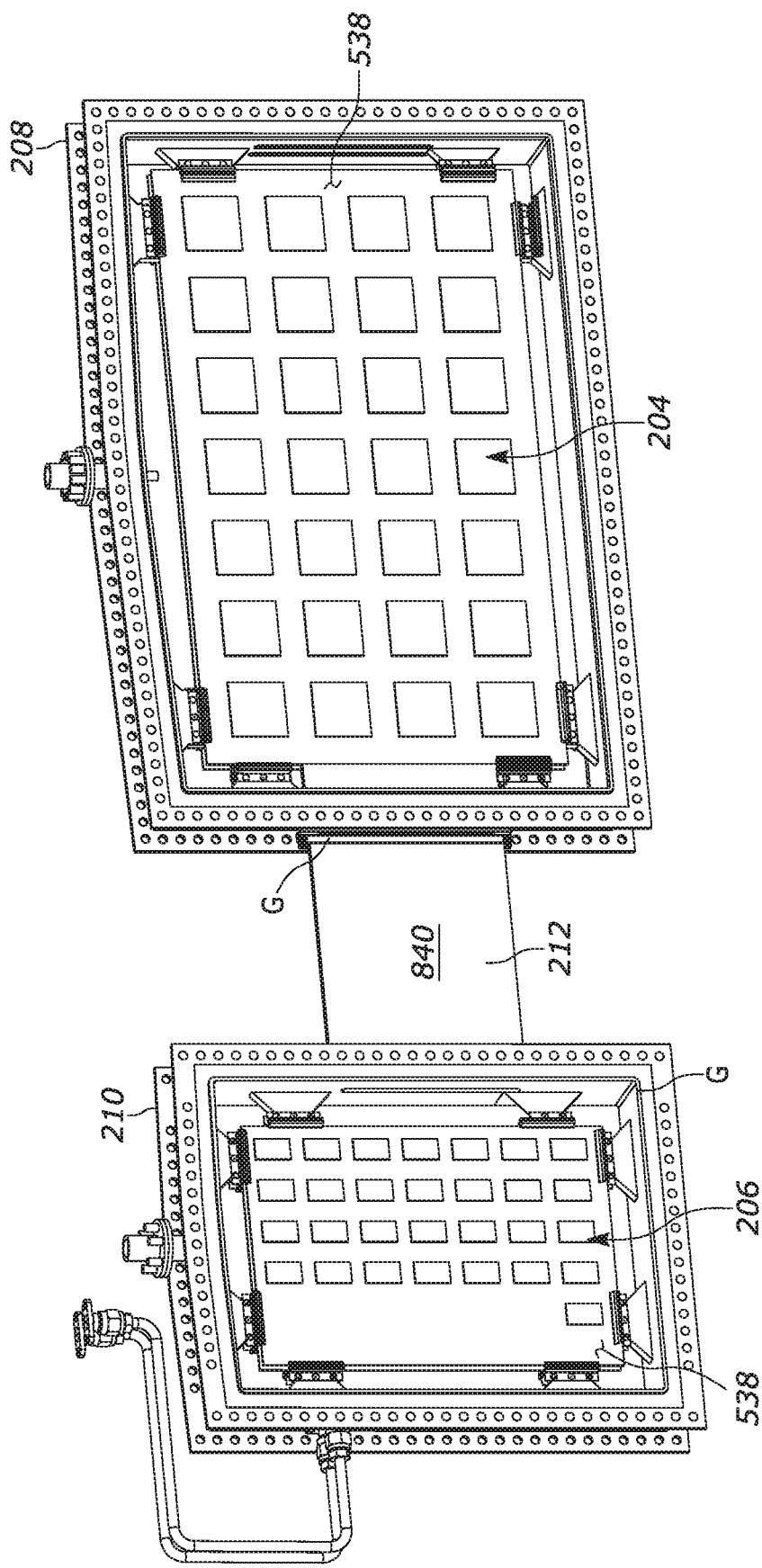
FIG. 8 is a schematic perspective view of a component of the example implementation of FIG. 1.

With reference to FIG. 8, the backing substrate 538 of each of the first and second circuit card subassemblies 204 and 206 is "suspended" from—i.e., held spaced apart from—the corresponding first or second perimeter frame 208 or 210 within the longitudinal-lateral plane. For example, such suspension may assist with cooling fluid flow or avoiding undesired thermal transfer within the corresponding first or second temperature tank 314 or 316. As shown in the exploded view of FIG. 9 (fasteners omitted therefrom), this suspension may be aided by the provision of brackets 942 to the first or second perimeter frame 208 or 210, to which the corresponding first or second circuit card subassembly 204 or 206 is held by at least one framing member 944. For example, an edge of the first or second circuit card subassembly 204 or 206 could be "sandwiched" between the bracket 942 and at least one framing member 944. It is contemplated that the edge could be held tightly via compressive force developed between the bracket 942 and at least one framing member 944 and/or that there could be little to no compression developed at that interface. It is contemplated that at least one framing member 944 may include a spring feature or other capability to bias or press the first or second circuit card subassembly 204 or 206 against the bracket 942.

As can be seen in FIG. 6, a laterally topmost edge of the first and second perimeter frames 208 and 210 (the horizontal "beams", in the orientation of FIG. 8) may be bowed or bent such that the manifold interface 730 is at a "high point" along that laterally topmost edge. As a result, vapor within the first and second temperature tanks 314 and 316 will tend to rise to that "ridge" location for removal.

Figure 9:
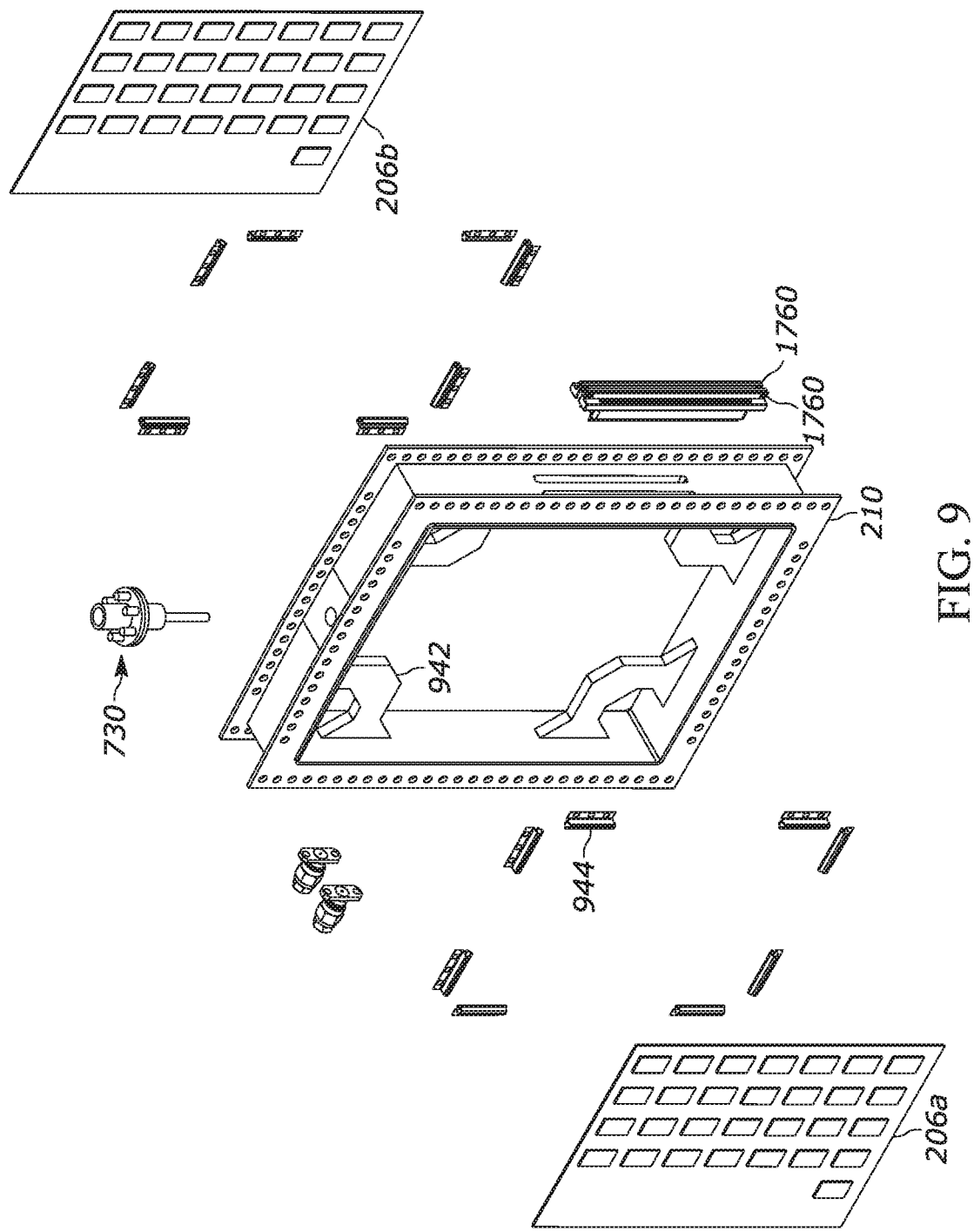
FIG. 9 is an exploded view of a component of FIG. 8.

FIG. 9 also depicts the way in which a single one of the first or second perimeter frames 208 or 210 can be used to help enclose a plurality of corresponding first or second circuit card subassemblies 204 or 206. That is, a single first or second perimeter frame 208 or 210 may substantially surround, in a longitudinal-lateral plane, at least two corresponding first or second circuit card subassemblies 204 or 206. As shown in FIG. 9 by way of example, two second circuit card subassemblies 206a and 206b are collectively associated with a single second perimeter frame 210. In this depiction, the two second circuit card subassemblies 206a and 206b are held back-to-back, optionally with a spacer (not shown) located therebetween to maintain a transversely spaced relationship. However, it is contemplated that one of ordinary skill in the art will be able to configure any desired number of circuit card subassemblies within a corresponding perimeter frame for a particular use environment of the apparatus 100.

Figure 10:
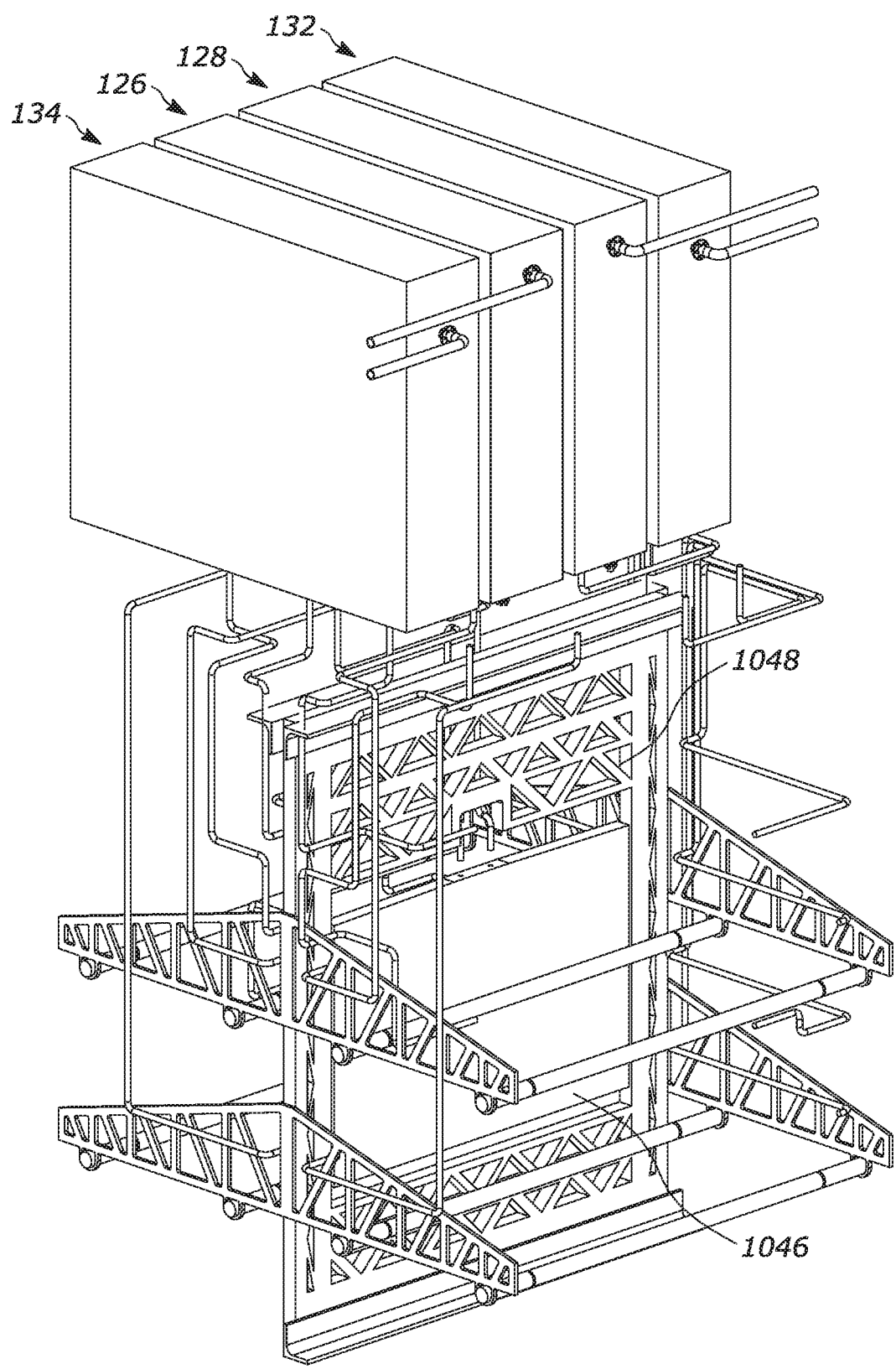
FIG. 10 is a schematic partial perspective view of the example implementation of FIG. 1.
Figure 11:
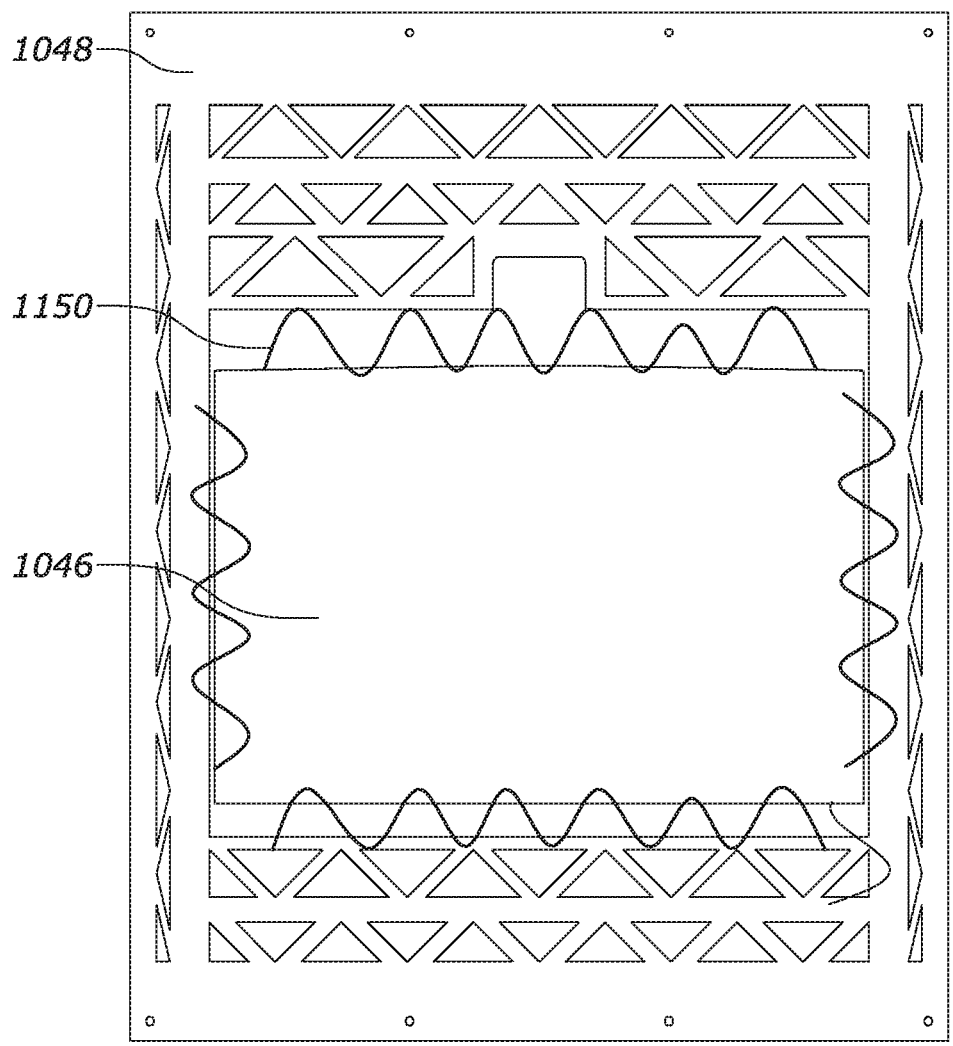
FIG. 11 is a front view of a component of FIG. 10.

FIGS. 10-11 show a view of the cooling fluid piping/circuit systems and racks which can be used to hold the circuit cards 202, with the circuit cards 202 and first and second perimeter frames 208 and 210 (among other structures) removed to aid visualization. In FIGS. 10-11 a network interconnect board 1046 is shown in position to interface with at least the first circuit card subassemblies 204, for transferring electrical power and/or signals to and/or from the first circuit card subassemblies 204. As shown in FIG. 2, the network interconnect board 1046 may be operatively coupled to a selected one of the first and second circuit card subassemblies 204 and 206, in a position that is longitudinally opposite from the other one of the first and second circuit card subassemblies 204 and 206. The network interconnect board 1046 may be carried or supported by frame 1048 in any desired manner, such as, but not limited to, being suspended from the frame 1048 by one or more thermal straps 1150. When present, the thermal straps 1150 may assist with thermally isolating the network interconnect board 1046 from the frame 1048. For example, the thermal straps 1150 may be made from a material such as Kevlar® aramid fiber, available from E. I. du Pont de Nemours and Company of Wilmington, Del. The frame may be made of a low thermal conductivity material, such as, but not limited to, G10 or Nylon 66.

Figure 12:
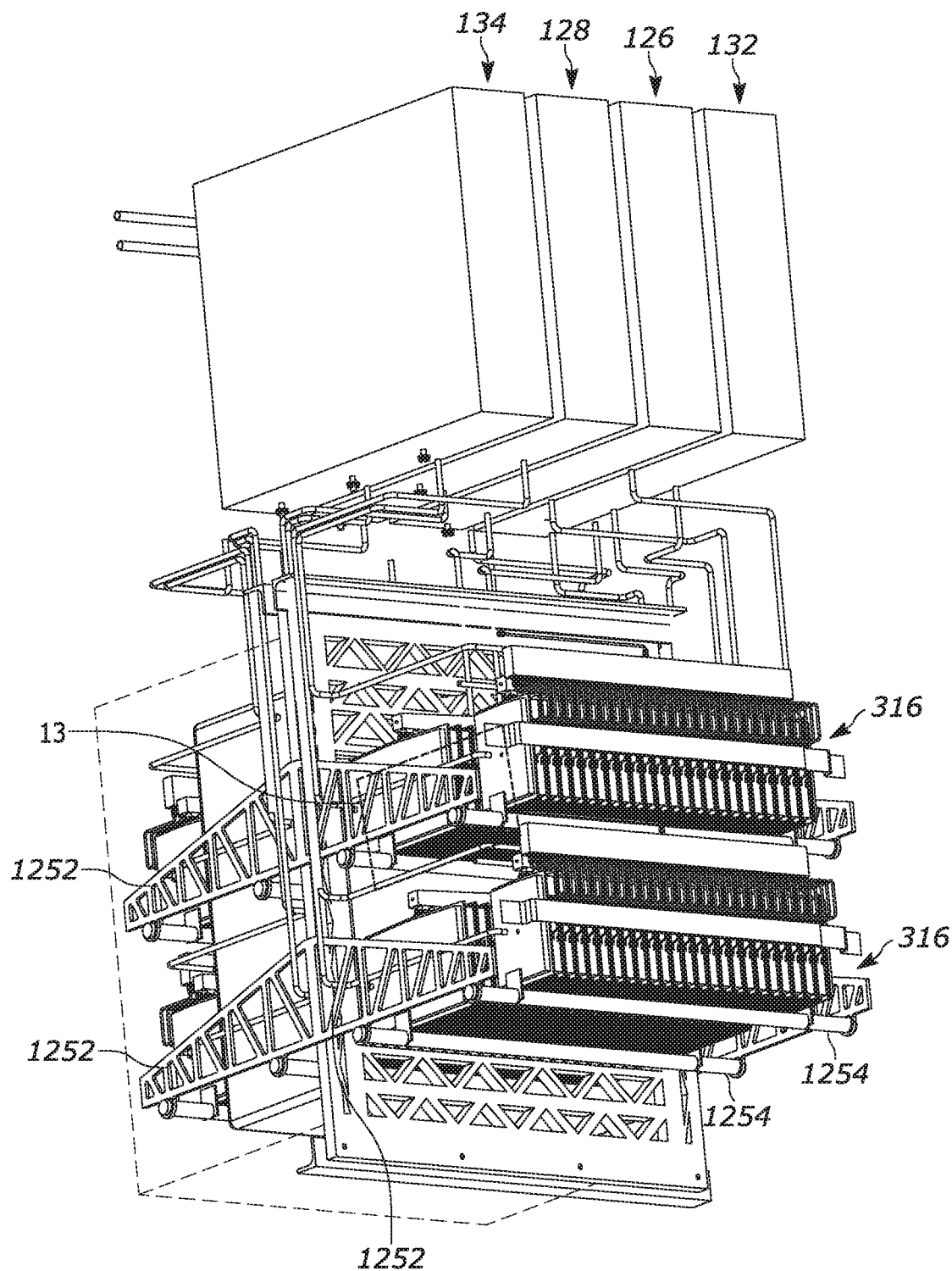
FIG. 12 is a schematic partial perspective view of the example implementation of FIG. 1.
Figure 13:
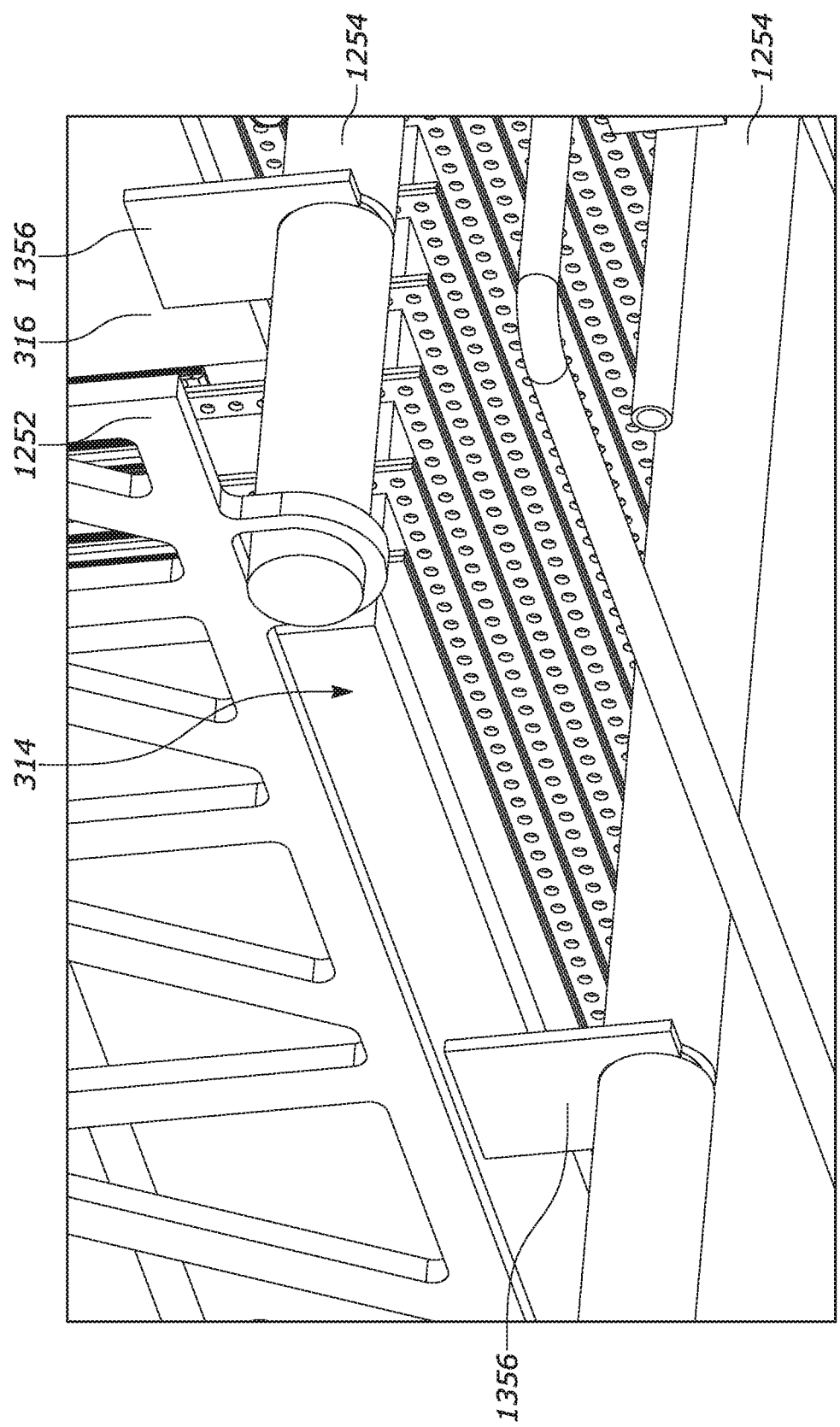
FIG. 13 is a detail view of area "13" of FIG. 12.
Figure 14:
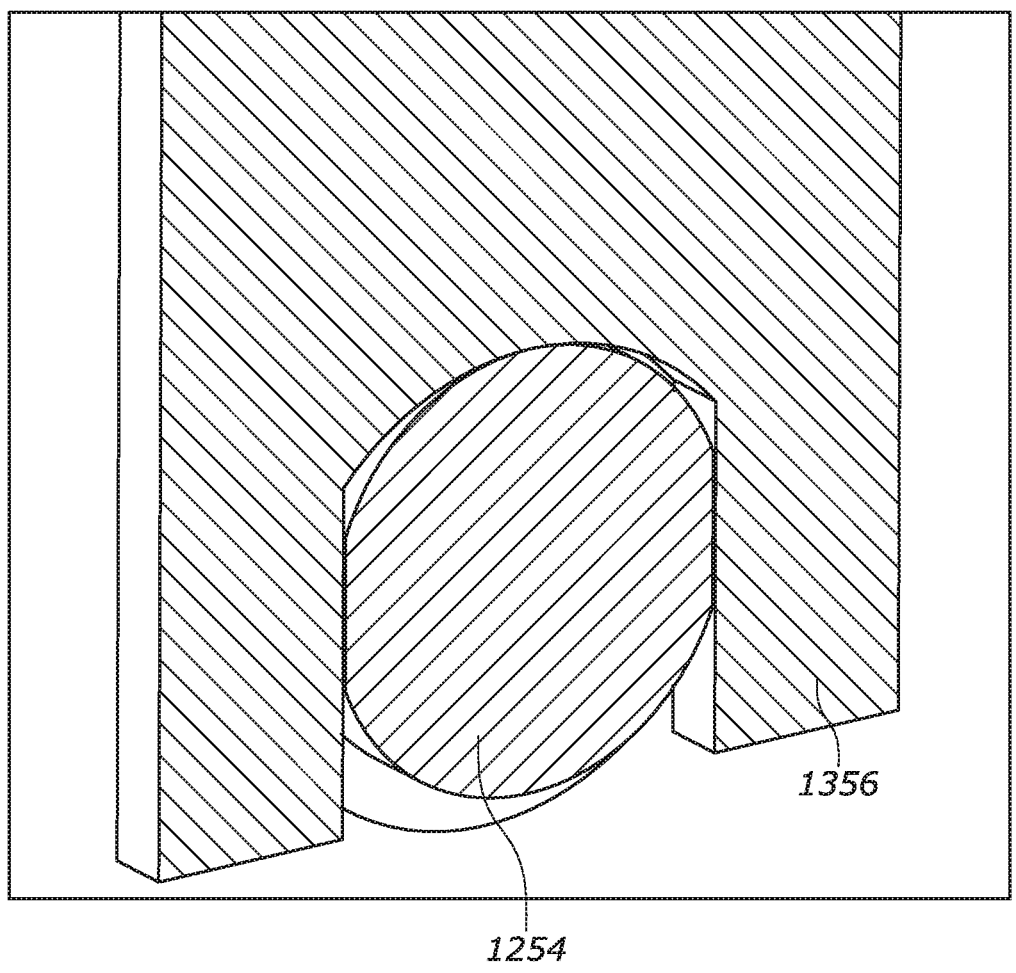
FIG. 14 is a schematic enlarged view of a component of FIG. 13.

With reference now to FIGS. 12-14, details of the way in which the first and second perimeter frames 208 and 210 are held within the apparatus 100 are shown. A plurality of trusses 1252 are cantilevered from the frame 1048, with support rods 1254 extending between transversely spaced pairs of trusses 1252. The triangular truss 1252 structure shown in the Figures increases the length of the thermal path in a desirable manner, as well as providing out-of-plane compliance and in-plane stiffness to help with supporting the circuit cards 202 in a robust yet flexible manner. The support rods 1254 help provide desired out-of-plane stiffness that the triangular trusses 1252 lack, to assist with providing reliable and sturdy support for the first and second perimeter frames 208 and 210. It should be noted that support portions of the apparatus 100 may be constructed in such a manner that the trusses 1252 could be configured to lengthen the thermal path. As a result, additional thermal isolation could be obtained between the circuit cards 202 and the frame 1048 or other supporting structure(s).

The first and second perimeter frames 208 and 210 are supported by, and may be attached to, the support rods 1254 in any desired manner. For example, and as shown in the detail view of FIG. 13, each of the first and second temperature tanks 314 and 316 may include one or more mounting tabs 1356. When present, the mounting tabs 1356 serve as "legs" to hold the corresponding first and second temperature tanks 314 and 316 laterally spaced from the rods 1254, to further thermally isolate the first and second temperature tanks 314 and 316 from the support rods 1254 and the frame 1048. As shown in the further detail view of FIG. 14, each mounting tab 1356 contacts the support rod 1254 at three points along the cross section of the support rod 1254 the interface between the mounting tab 1356 and the support rod 1254 is therefore conical, to prevent full surface contact between the two structures which might provide an unwanted thermal path therebetween. Mounting tabs 1356 allow for a mismatch in the coefficients of thermal expansion of certain structures of the apparatus 100, by allowing a limited degree of motion between the support rods 1254 and the first and second temperature tanks 314 and 316.

Turning now to FIGS. 15-22, various details of the construction and assembly of the first and second circuit card subassemblies 204 and 206 are shown. Though second circuit card subassembly 206 is shown in these Figures as an example, one of ordinary skill in the art will be able to extrapolate the depicted and described construction and configuration details to first circuit card subassembly 204, as desired.

Figure 15:
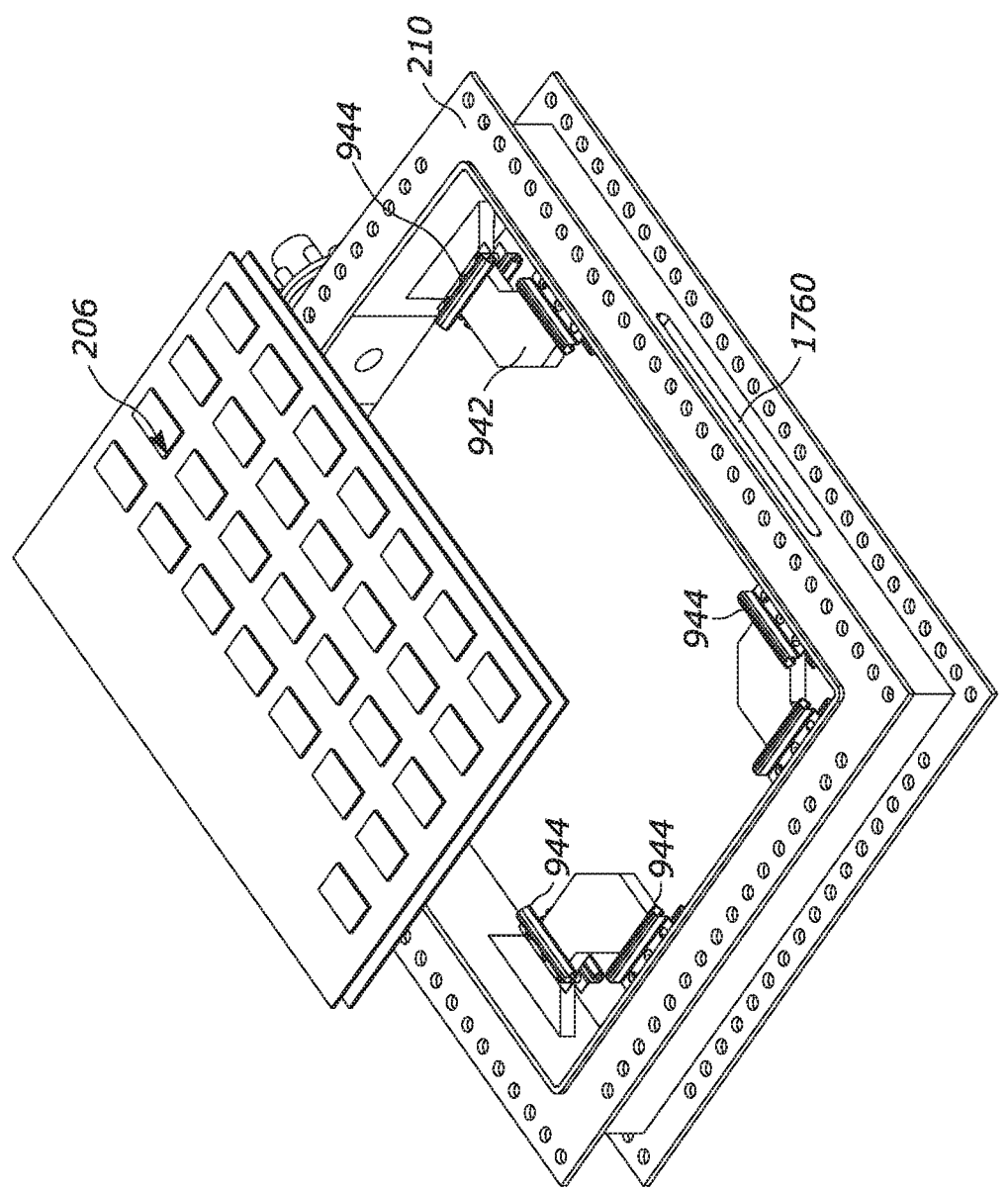
FIGS. 15-16 schematically depict an assembly of a component of the example implementation of FIG. 1.
Figure 16:
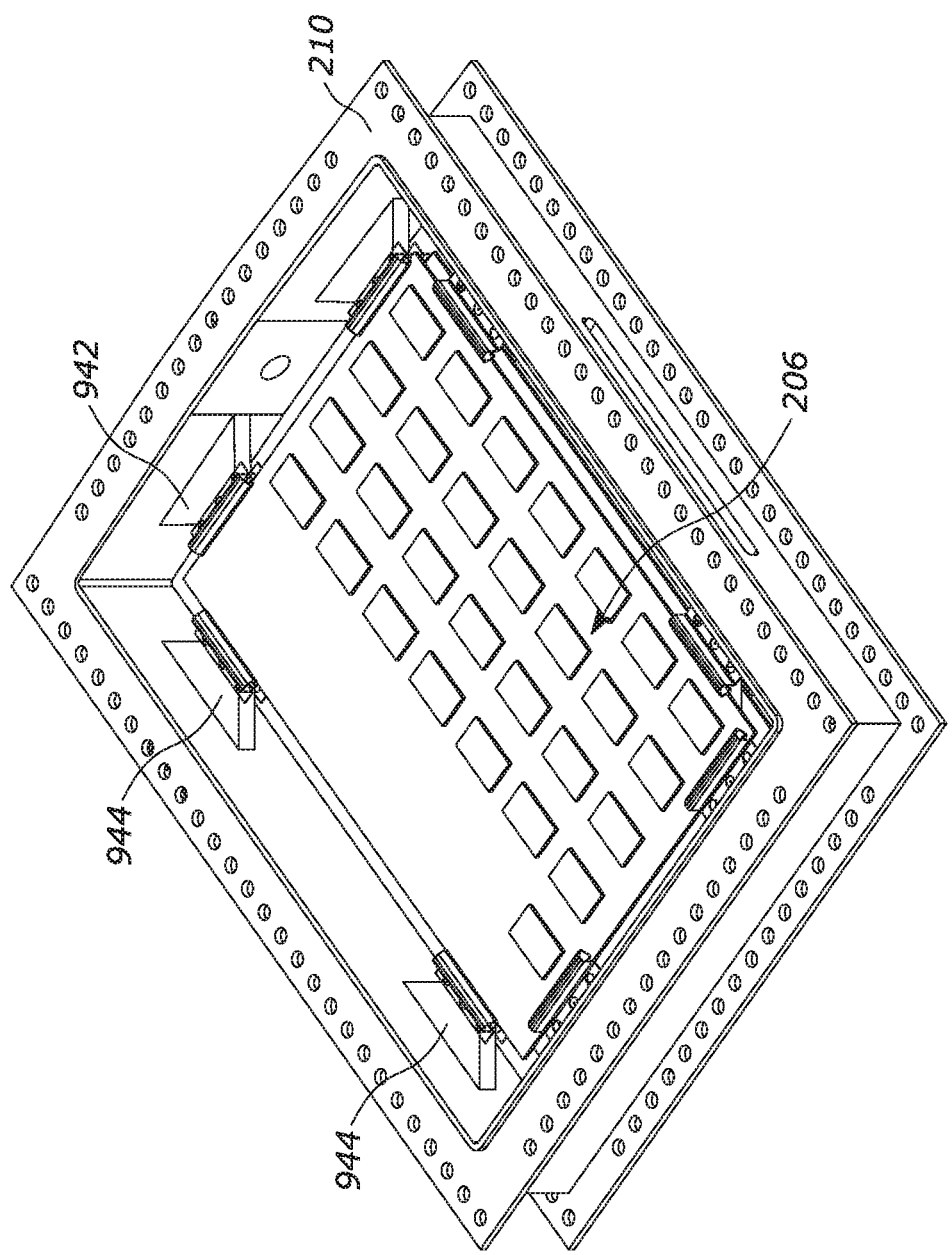

In FIG. 15, spring-type framing members 944 are shown as having already been attached into a predetermined relationship with brackets 942. Second circuit card subassembly 206 is installed into second perimeter frame 210 by being pressed down word from the position in FIG. 15 to the position in FIG. 16. The detail view of FIG. 17 shows how the two second circuit card assemblies 206a and 206b are held or "snapped" into place by the framing members 944.

Figure 17:
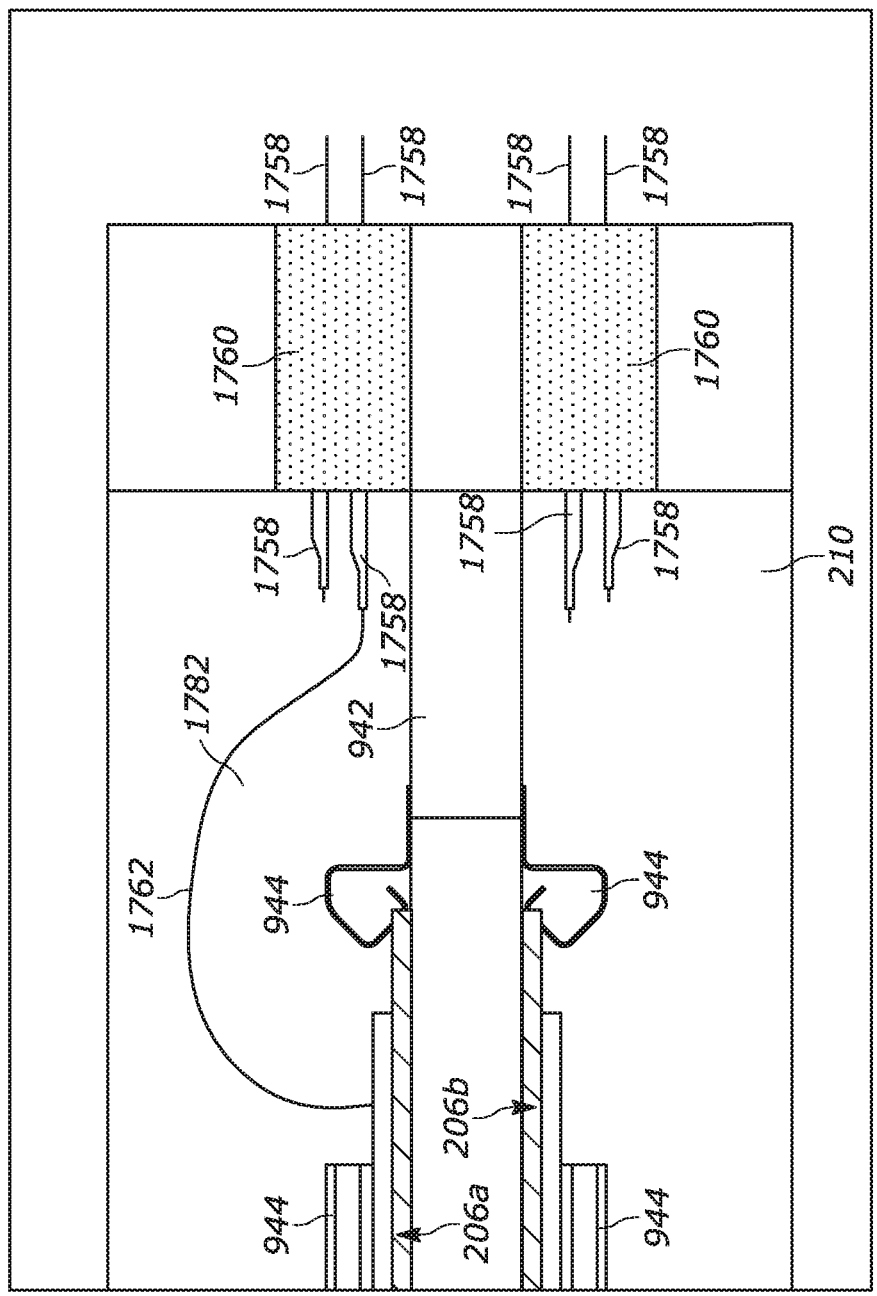
FIG. 17 is a partial view of a component of the example implementation of FIG. 1.

FIG. 17 also shows the way in which an example connector pin 1758 of a hermetic high density connector 1760 is connected via wire 1762 to a pad or other signal-transferring feature of the second circuit card subassembly 206. The connector 1760 allows for electrical and/or signal-transferring connections to be made into and out of the interior of the first or second perimeter frame 208 or 210, as will be discussed below. The connectors 1760, when present, can be installed into the wall of the first or second perimeter frame 208 or 210, as shown in FIG. 15, hermetically using laser welding, soldering, vacuum adhesive, or any other desired sealing technique.

Figure 18:
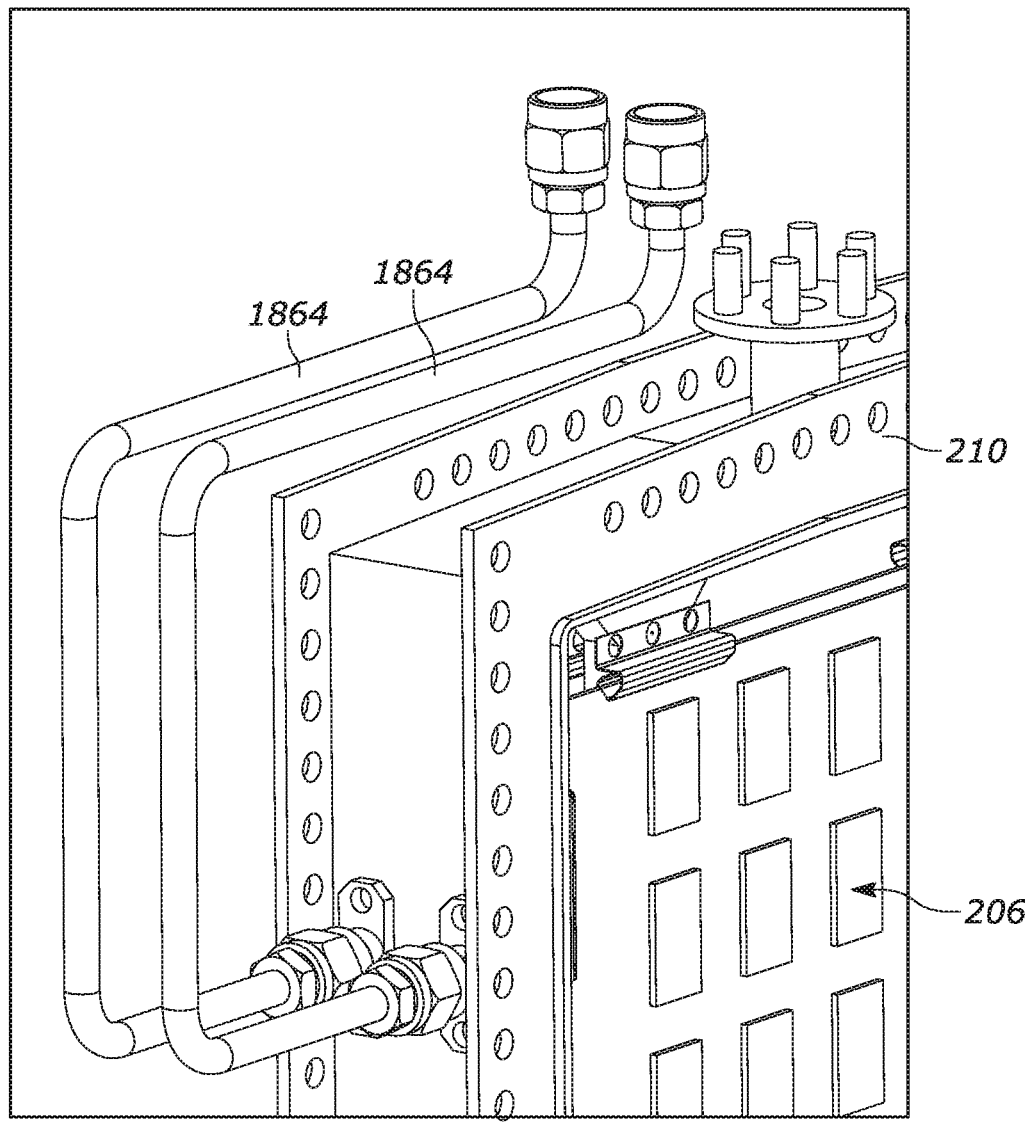
FIG. 18 is a partial view of a component of the example implementation of FIG. 1.
Figure 19:
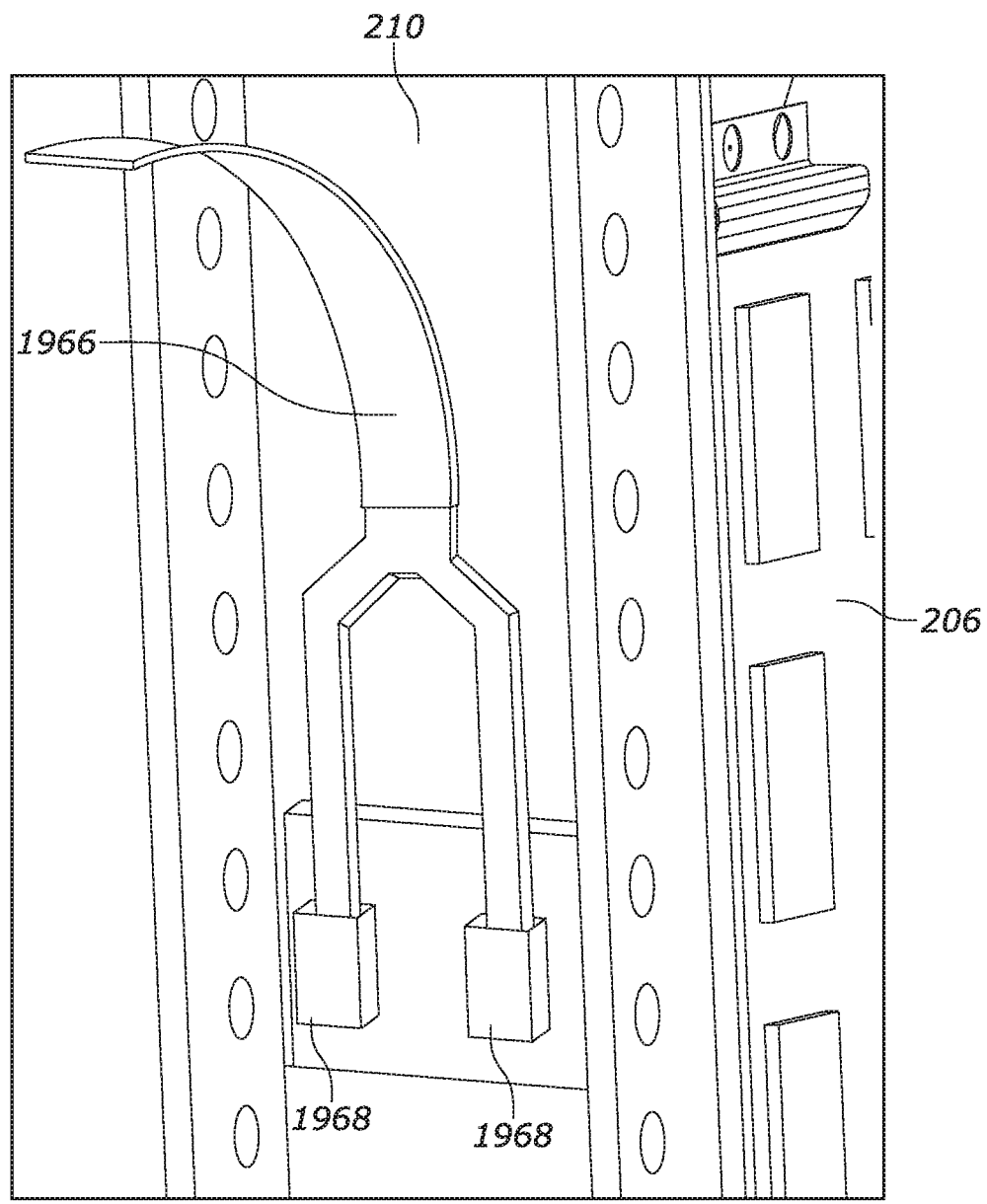
FIG. 19 is a partial view of a component of the example implementation of FIG. 1.

FIGS. 18-19 depict ways in which various electrical and/or signal-transferring connections can be made with other computer equipment located in an ambient space to the apparatus 100. FIG. 18 shows clock connections made through conduits 1864. At least a selected one of the first and second perimeter frames 208 and 210 may include a mechanical and/or optical interface for signal-transmitting connection to a respective one of the first and second circuit card subassemblies 204 and 206. FIG. 19 shows optical connections made through cable ribbon 1966 and mechanical/optical interfaces 1968, such as via the PRIZM® connectors shown, available from US Conec of Hickory, N.C. It should be noted that both the clock and optical connections shown in FIGS. 18-19 are accomplished in pairs, due to the back-to-back dual second circuit card subassemblies 206a and 206b contained within the single second perimeter frame 210.

Figure 20:
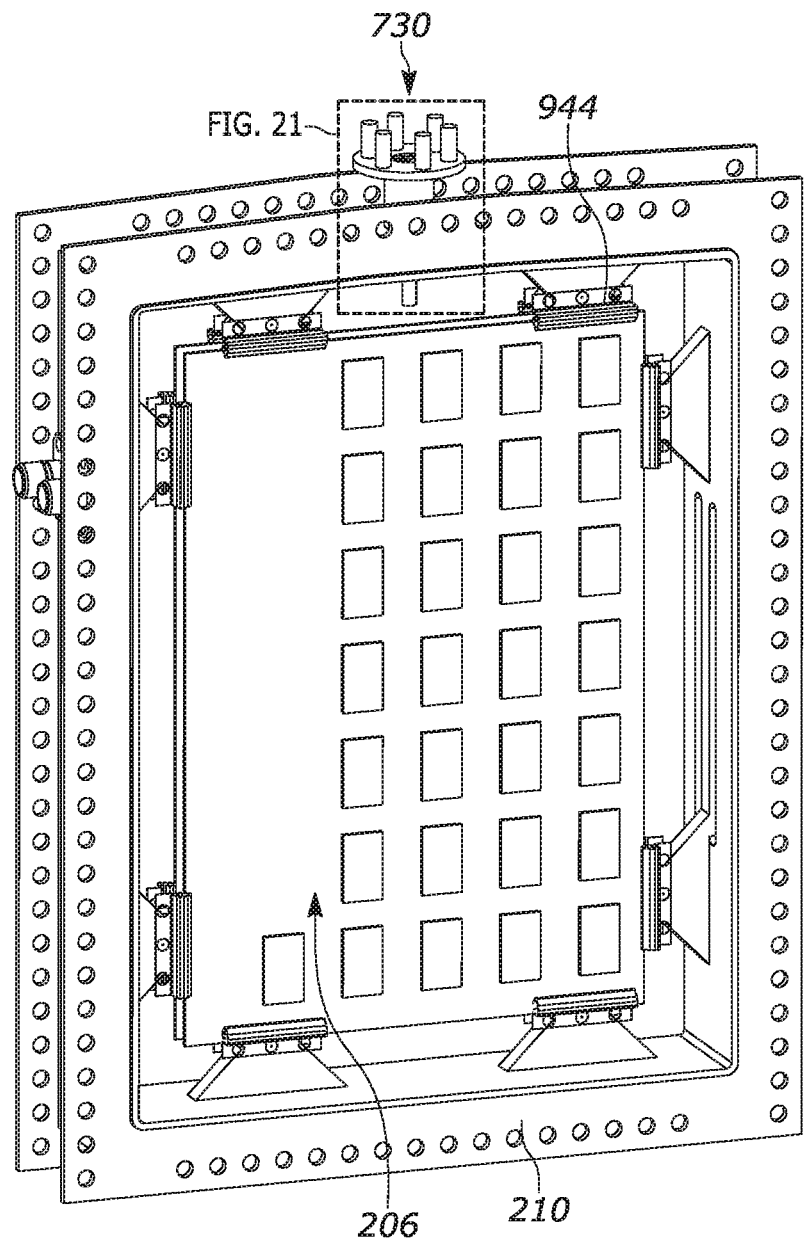
FIG. 20 is a partial view of a component of the example implementation of FIG. 1.
Figure 21:
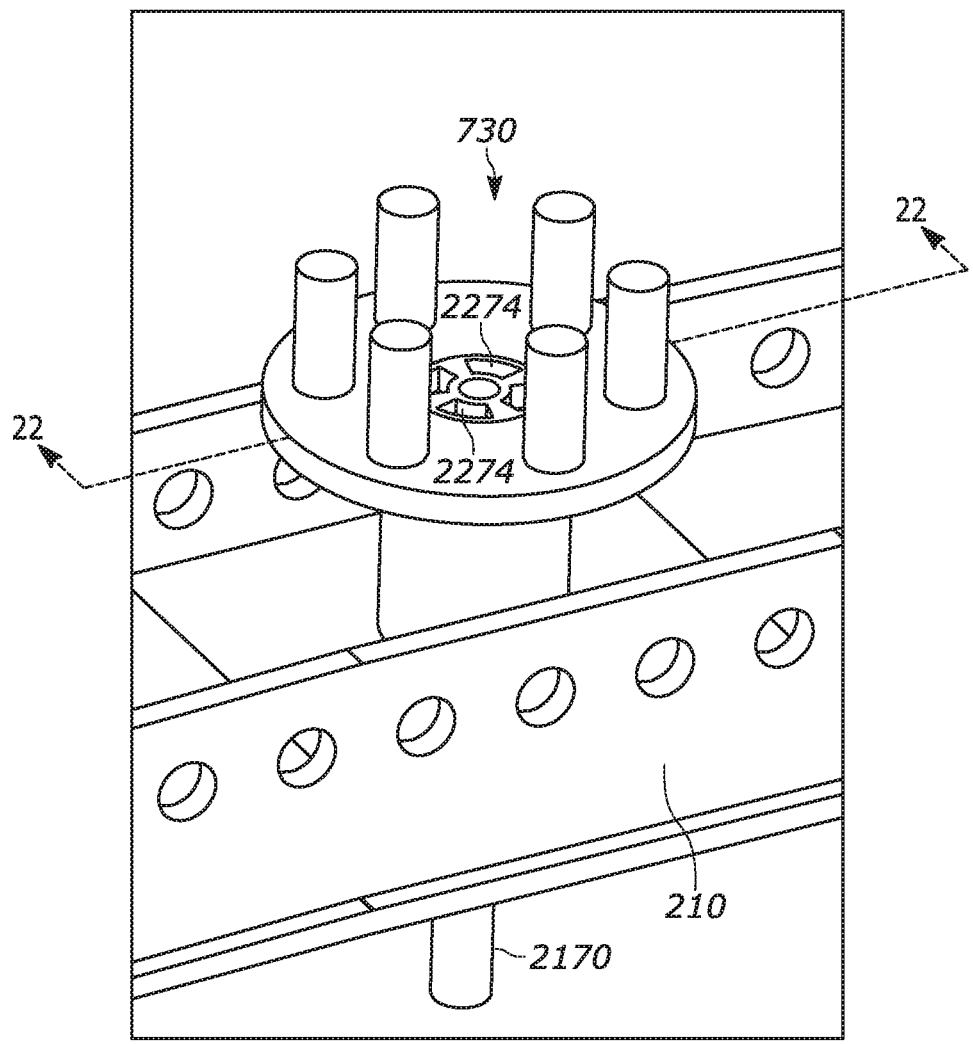
FIG. 21 is a detail view of area "21" of FIG. 20.
Figure 22:
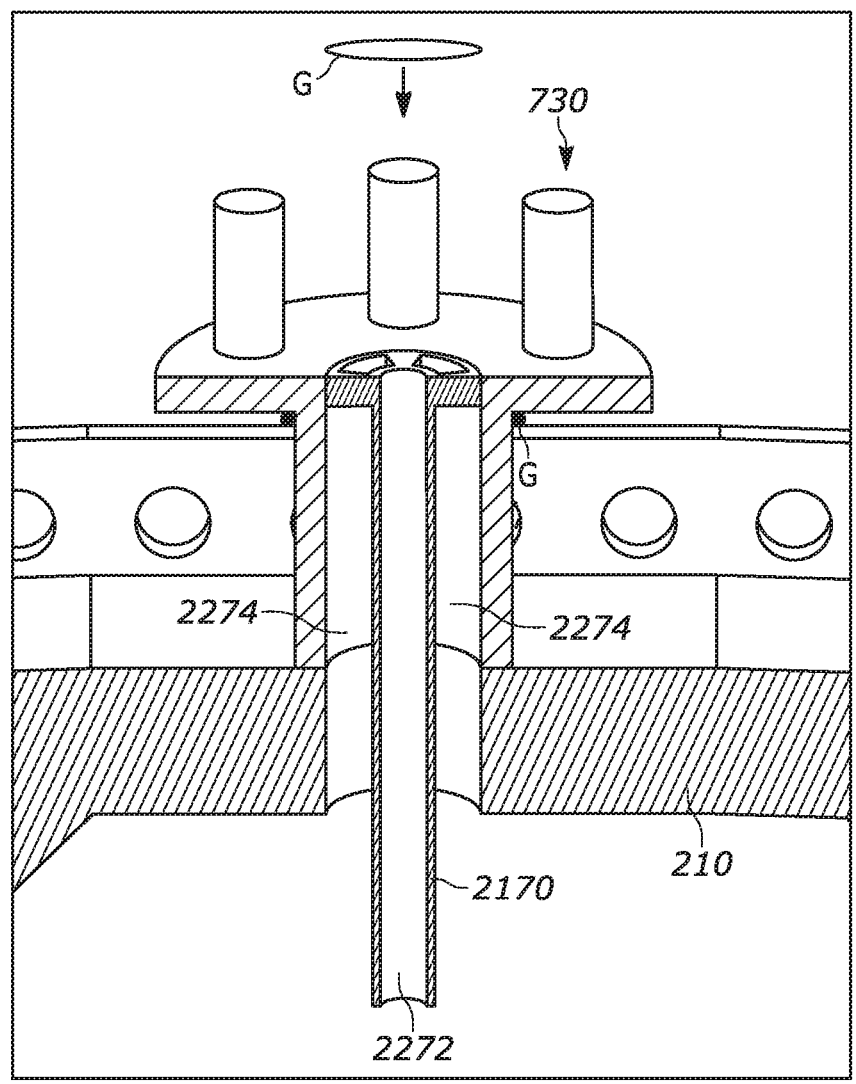
FIG. 22 is a cross-sectional view taken along line 22-22 of FIG. 21.

With reference to FIGS. 20-22, various details of the manifold interface 730 are shown. FIG. 21 is a detail view of the area indicated in FIG. 20. As shown in FIG. 21, the manifold interface 730 includes a stem 2170 which extends completely through a thickness of the second perimeter frame 210. As is further depicted in the cross-sectional view of FIG. 22, stem 2170 facilitates fluid communication between an interior of the first or second temperature tank 314 or 316 and the corresponding first or second temperature cooling supply line 318 or 320 via lumen 2272 as is also apparent from FIG. 22, thence 2274 may be provided to allow vapor, or otherwise "spent" cooling fluid, to egress the first or second temperature tank 314 or 316 and be conveyed from the interior of the respective tank, through the vents 2274, and to either an ambient space or a first or second cooling fluid destination 132 or 134.

There may be one or more indium gaskets G interposed laterally between two or more of the manifold interface 730 and other structures of the apparatus. For example, an indium gasket may be interposed laterally between at least one of the first and second temperature tanks 314 and 316, and a corresponding one of the first and second temperature cooling supply lines 318 and 320 and/or the first and second temperature cooling return manifolds 322 and 324. As another example, an indium gasket may be interposed laterally between at least one of (a) the manifold interface 730 and the selected one of the first and second temperature tanks 314 and 316 (this would be the lower gasket G, shown in cutaway form in FIG. 22, underneath the top flange of the manifold interface 730), and (b) the manifold interface 730 and the corresponding one of the first and second temperature cooling supply lines 318 and 320 (this would be the upper gasket G shown as a complete circle or "halo" toward the top of FIG. 22).

Figure 4:
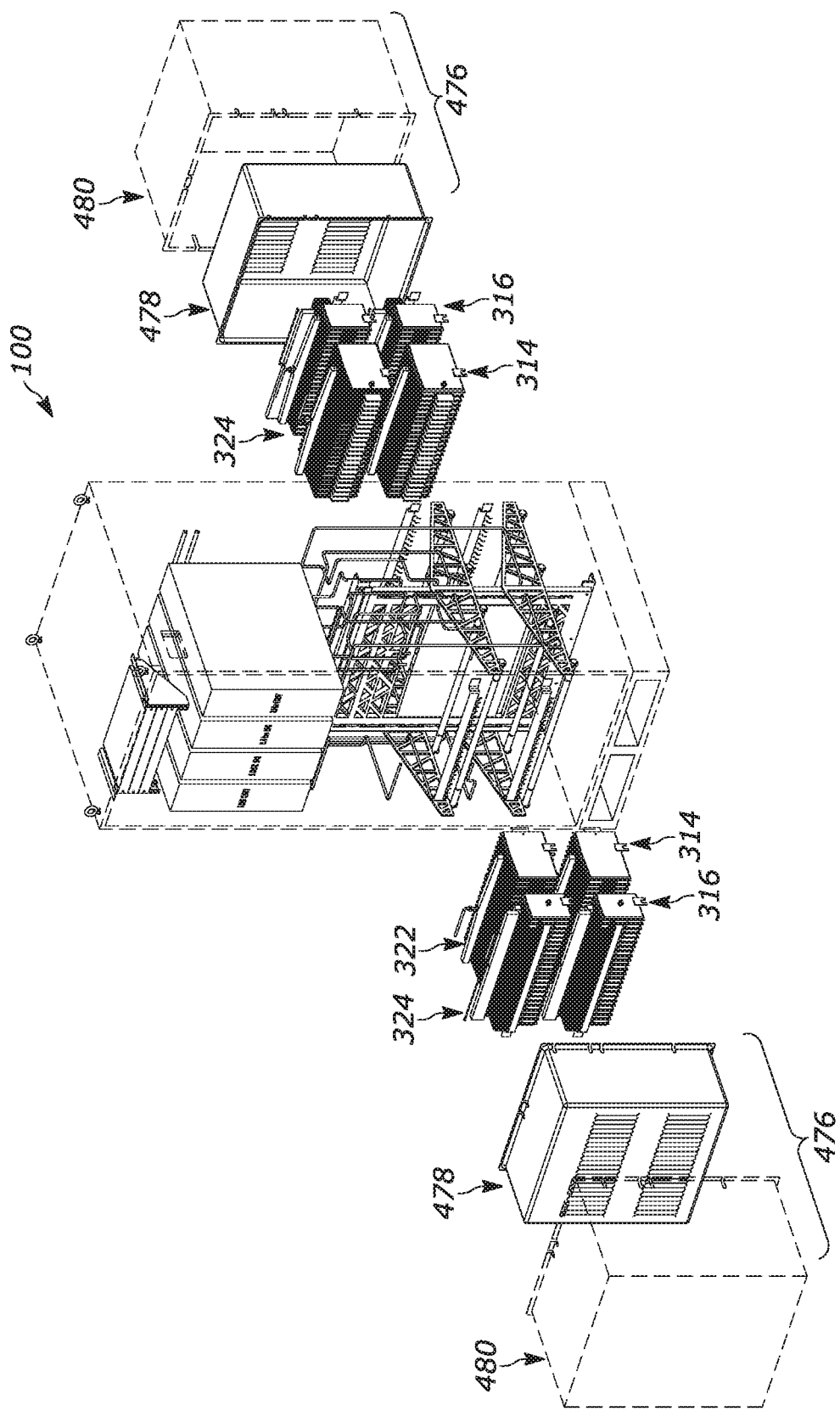
FIG. 4 is an exploded front perspective view of the example implementation of FIG. 1.

Details of insulation structures for assisting with desired thermal isolation of the first and second circuit card subassemblies 204 and 206 are shown in FIGS. 2 and 4. A multi-layer insulation shield 476 is depicted in exploded view in FIG. 4. The multi-layer insulation shield 476 comprises a first temperature shield 478 and a second temperature shield 480. Due to the "mirrored" nature of the apparatus 100 shown in FIGS. 2 and 4, there are two multi-layer insulation shield 476 shown. FIG. 2 depicts the way in which the first temperature shield 478 at least partially encloses just the first temperature tanks 314, with the second temperature tanks 316 located outside the first temperature shields 478 but inside the second temperature shields 480 in this way, the multi-layer insulation shield 476 provides variable thermal shielding to the first and second temperature tanks 314 and 316 while helping to thermally isolate them from one another. The multi-layer insulation shield 476 substantially surrounds at least one of the first and second temperature tanks 314 and 316 on at least four of six orthogonal sides. In order to help connect the first and second circuit card subassemblies 204 and 206, the card connector 212 extends completely through a wall of the multi-layer insulation shield 476. In the configuration of the apparatus 100 shown in the Figs., the card connector 212 extends completely through an interior wall of the multi-layer insulation shield 476—i.e., a wall of the first temperature shield 478.

With reference to FIGS. 2 and 23-25, one example scheme for providing the desired electrical and/or signal connections between portions of the apparatus 100 is shown. As depicted in the exploded view of FIG. 23, the network interconnect board 1046 includes a plurality of stations 2382, each of which is configured to connect to a single circuit card 202. For example, interconnect connector 2384 could extend between the circuit card 202 (such as from the hermetic high density connector 1760) and the network interconnect board 1046.

Figure 23:
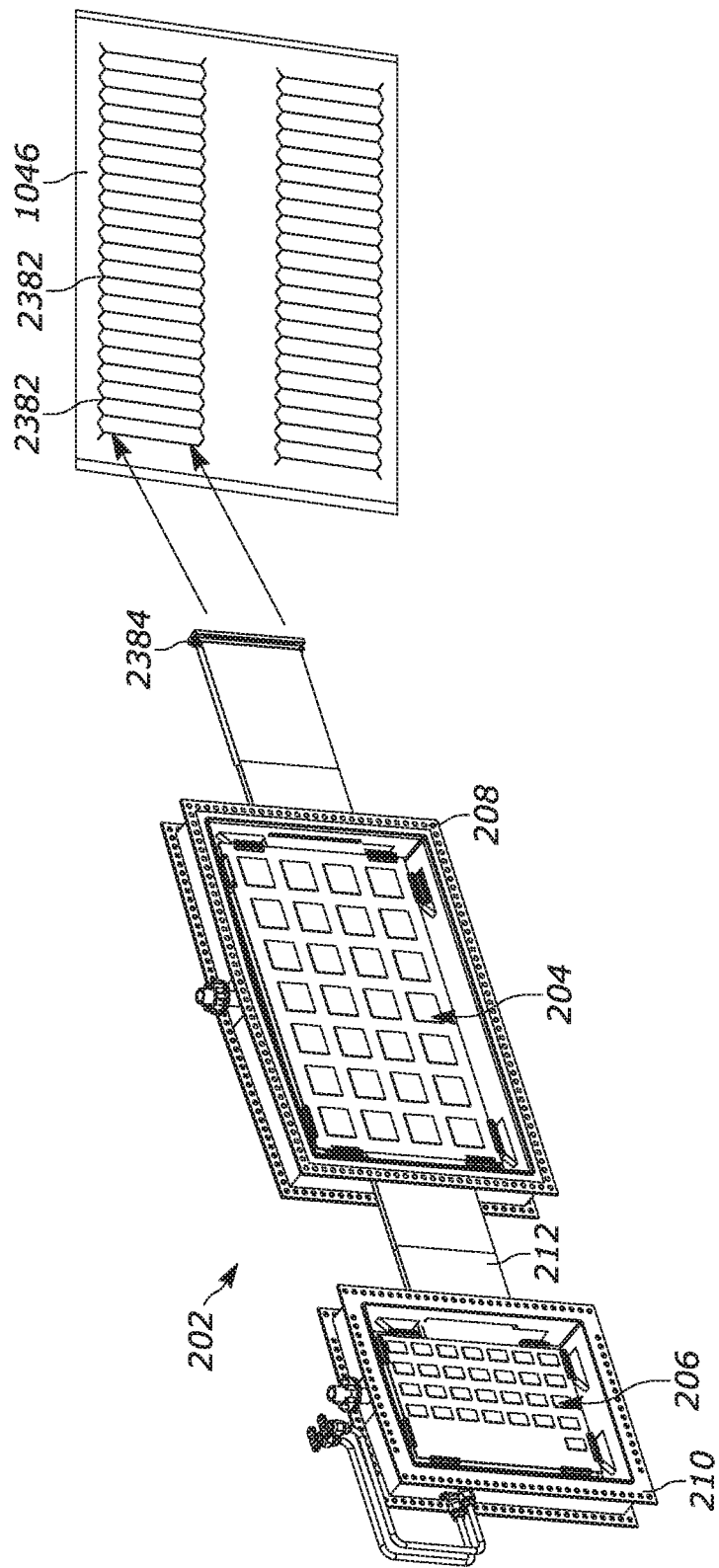
FIG. 23 is a partial exploded view of a component of the example implementation of FIG. 1.
Figure 24:
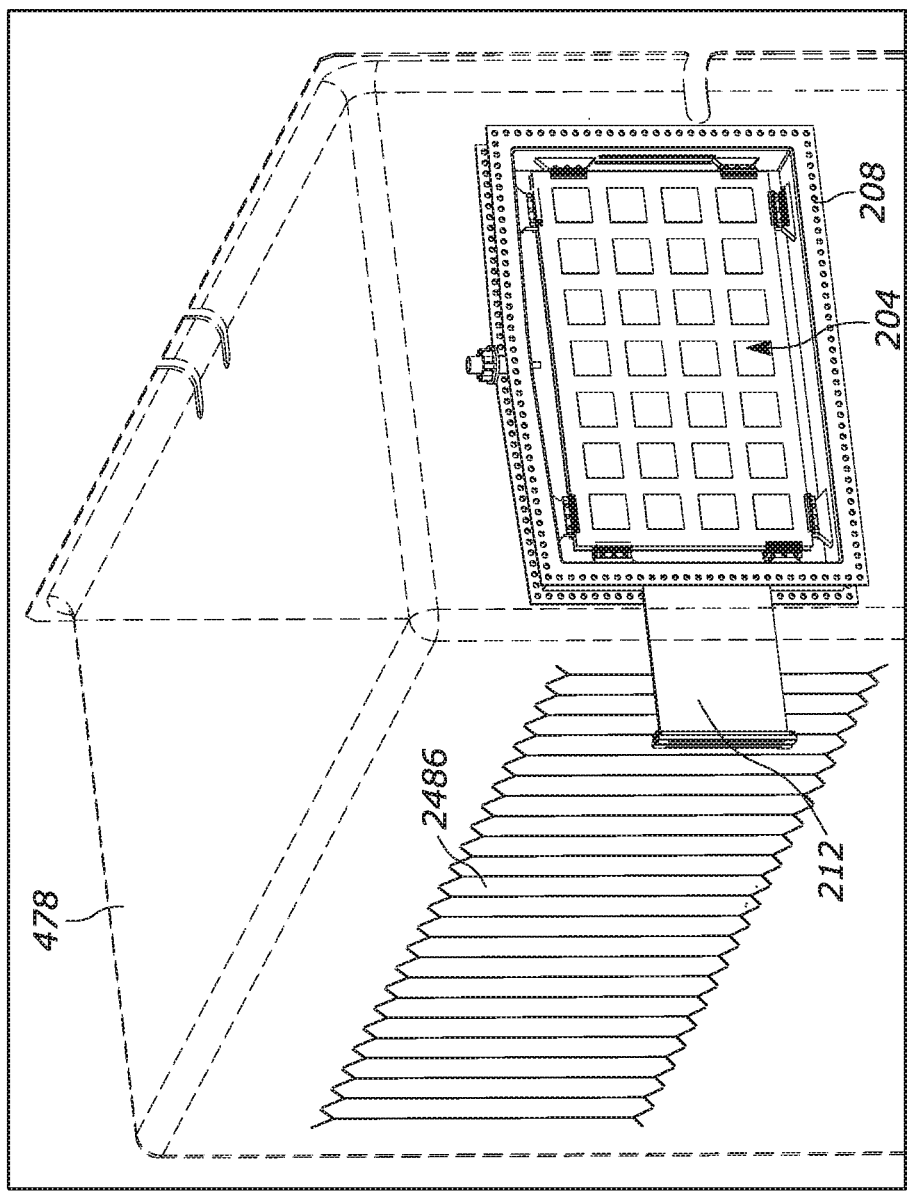
FIGS. 24-25 schematically depict an assembly of a component of the example implementation of FIG. 1.
Figure 24:
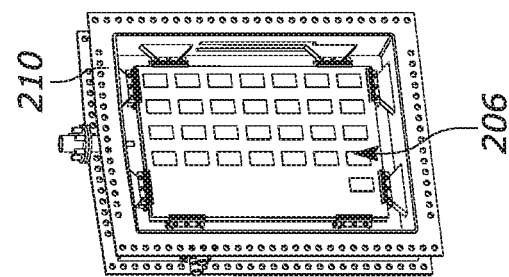
Figure 25:
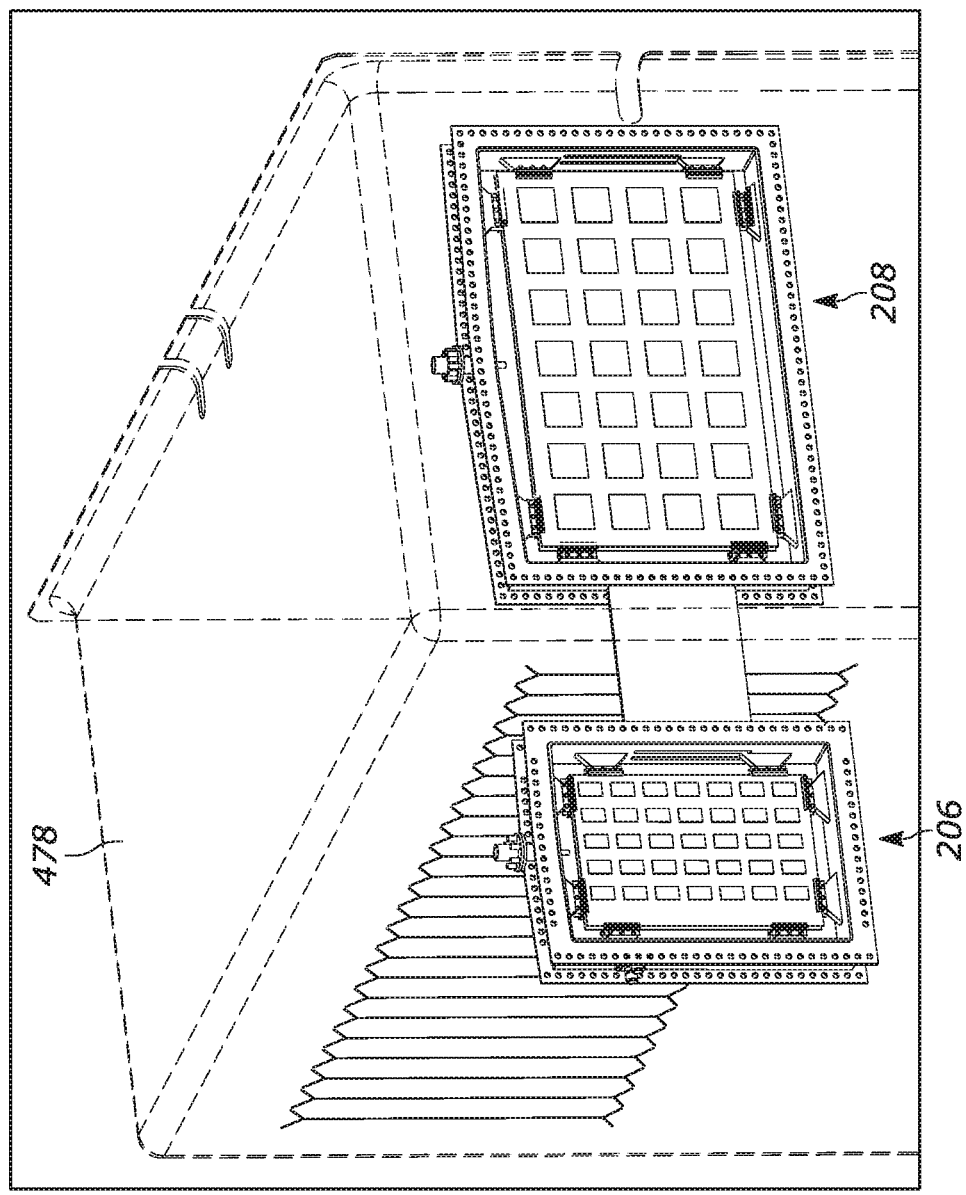
Figure 26:
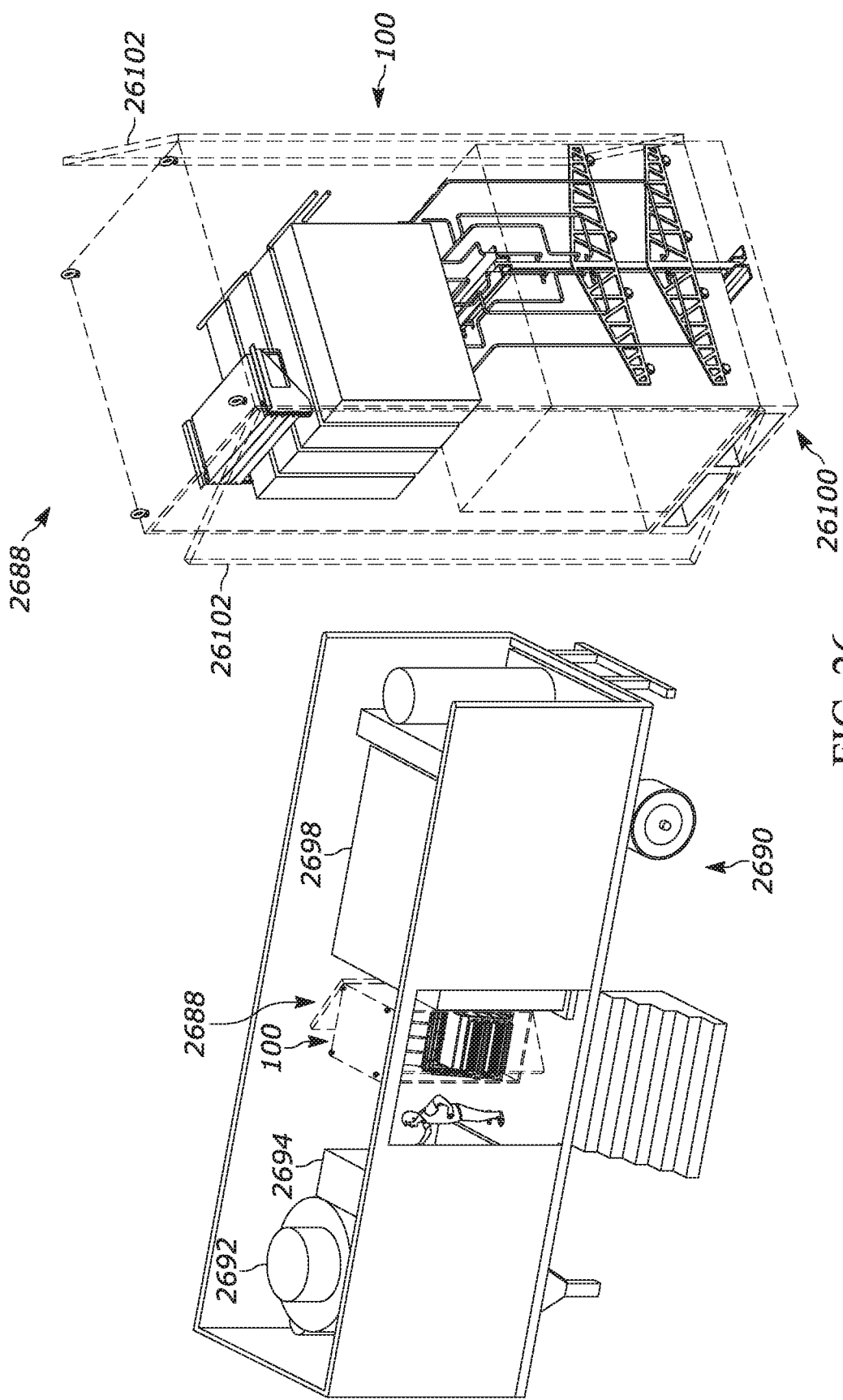
FIG. 26 schematically depicts the example implementation of FIG. 1 in an example use environment.

In FIG. 23, the first and second circuit card subassemblies 204 and 206 are depicted as already having been placed into signal-exchanging connection via card connector 212. It is contemplated, though, that the connection between the first and second circuit card subassemblies 204 and 206 can be made instead as shown in the sequence of FIGS. 24-25. That is, the first circuit card subassembly 204 could be placed within the first temperature shield 478, with the circuit card connector 212 extending through a slit 2486 in the wall of the first temperature shield 478. Then, the card connector 212 could be connected to the second circuit card subassembly 206, and the second temperature shield 480 of the multi-layer insulation shield 476 can then be placed around the entire construct that is shown in FIG. 26. One of ordinary skill in the art will be able to readily provide a suitable assembly or manufacturing scheme as desired for the apparatus 100.

Turning now to FIG. 26, a system 2688 for providing immersion cooling in a compact-format circuit card environment is shown. As depicted schematically in FIG. 26, the system 2688 could be located within a trailer 2690 or other modular workspace for either temporary or permanent location at a desired worksite. For example, the trailer 2690 could include a helium and/or nitrogen liquifier 2692 and other support equipment (including, for example, control panel 2694 and compressor/oil removal 2698) to facilitate at least partially independent operation of the system 2688 at the desired worksite.

The system 2688 shown in FIG. 26 includes an apparatus 100 comprising the features and structures previously described with reference to FIGS. 1-25. For example, the apparatus 100 includes a circuit card 202 including first and second circuit card subassemblies 204 and 206 and first and second temperature tanks 314 and 316, which are each in fluid communication with one or more of first and second cooling fluid sources 126 and 128, and first and second cooling fluid destinations 132 and 134, as appropriate. As shown in FIG. 26, a cabinet 26100 supports and at least partially encloses the apparatus 100, the first and second cooling fluid sources 126 and 128, and the first and second cooling fluid destinations 132 and 134. The cabinet 26100 includes at least one door 26102 for providing selective access to the apparatus 100. The cabinet 26100 or other portions of the system 2688 may include any desired number and type of ancillary features including, but not limited to, ventilation apertures and/or fans, shock absorbers or other cushioning structures, locks or other security features, magnetic shielding of any portion of the apparatus 100, space for carrying conventional (non-cryogenic) computing equipment, and/or any desired connectors to facilitate electrical and/or signal-transferring connection between the apparatus 100 and an ambient space outside the cabinet 26100.

For some use environments, it may be helpful to reduce potential heat transfer between the cabinet 26100 and the apparatus 100. Accordingly, the cabinet 26100 may have an interior space that is at least partially under vacuum during use of the apparatus 100.

Through use of the system 2688, increased computing power can be provided, temporarily and/or permanently, in a compact-footprint configuration that may be very helpful in a space, such as an aircraft interior, which has limited room. For example, a cryogenic supercomputer using an apparatus 100 such as that shown and described herein could provide more than one hundred teraflops of computing capacity onboard an aircraft while consuming about fifty watts of electricity. This is significantly higher performance, with less power draw, than non-cryogenic computing systems currently available in aircraft applications. However, the cryogenic support systems needed to maintain appropriate operating temperatures (e.g., 4 K for RQL processors and 77 K for memory) require scarce space aboard the aircraft. Often, the low-temperature components of the cryogenic supercomputer are cooled with immersion cooling techniques. Accordingly, the system 2688 can be configured for providing dual-temperature immersion cooling in a compact-format circuit card environment. Though and aircraft use environment is given here as an example, one of ordinary skill in the art will understand that the system 2688 (or the apparatus 100 itself) could be used in any desired use environment, such as, but not limited to, one in which transportation and/or operating space is at a premium (e.g., submarine, spacecraft, remote scientific station, or the like).

FIG. 27 is a flowchart depicting an example sequence of operation for providing immersion cooling in a compact-format circuit card environment, using the apparatus 100 as shown and described herein. In first action block 27104, the apparatus 100 is provided, complete with circuit cards 202 including first and second longitudinally spaced circuit card subassemblies 204 and 206, first and second temperature tanks 314 and 316, and first and second temperature cooling supply lines 318 and 320.

The method moves to second action block 27106, where the first circuit card subassemblies 204 are at least partially exposed to the first operating temperature via placing at least one first temperature cooling supply line 318 in selective fluid communication with an interior of the first temperature tank 314. When a manifold interface 730 is present, the first temperature cooling supply line 318 may be placed in fluid communication, which may be bidirectional fluid communication, with the tank interior of the first temperature tank 314 via the at least one manifold interface 730.

A first cooling fluid is selectively introduced into, and selectively removed from, the first temperature tank 314 in third action block 27108, such as through operation of the first temperature cooling supply line 318. In fourth action block 27110, the first cooling fluid is convectively circulated around the plurality of first circuit card subassemblies 204 within the first temperature tank 314 to at least partially induce the first operating temperature.

Analogously, in fifth action block 27112, the second circuit card subassemblies 206 are at least partially exposed to the second operating temperature via placing at least one second temperature cooling supply line 320 in selective fluid communication, which may be bidirectional fluid communication, with an interior of the second temperature tank 316. When a manifold interface 730 is present, the second temperature cooling supply line 320 may be placed in fluid communication with the tank interior of the second temperature tank 316 via the at least one manifold interface 730.

In sixth action block 27114, a second cooling fluid is selectively introduced into, and selectively removed from, the second temperature tank 316. Finally, in seventh action block 27116, the second cooling fluid is convectively circulated around the plurality of second circuit card subassemblies within the second temperature tank to at least partially induce the second operating temperature.

During performance of the method shown in FIG. 27, it is contemplated that first and second cooling fluid sources 126 and 128 could be placed in fluid supplying communication with the first and second temperature cooling supply lines 318 and 320, respectively. It is also contemplated that first and second cooling fluid destinations 132 and 134 could be placed in fluid removing communication with the first and second temperature tanks 314 and 316, respectively, via the first and second temperature cooling return manifolds 322 and 324.

As previously mentioned with reference to FIG. 26, at least one apparatus 100, the first and second cooling fluid sources 126 and 128, and the first and second cooling fluid destinations 132 and 134 may be supported in at least partially enclosed within a cabinet 26100. It is contemplated that, for certain use environments, the cabinet 26100 could be deployed as a standard-dimension data center server rack.

It is also contemplated that the cabinet 26100 could be within, or could itself comprise, a trailer 2690 or other transport container, in which case the transport container could be deployed as desired to a location for temporary data processing capability augmentation.

Additionally, it is contemplated that the apparatus 100 and/or the system 2688 could be scalable, with multiple "sets" of first and second temperature tanks 314 and 316 and accompanying structures and features provided for a particular use environment.

While aspects of this disclosure have been particularly shown and described with reference to the examples above, it will be understood by those of ordinary skill in the art that various additional examples may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one example or configuration could be provided, singly or in combination with other structures or features, to any other example or configuration, as it would be impractical to describe each of the examples and configurations discussed herein as having all of the options discussed with respect to all of the other examples and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

We claim:

1. An apparatus for providing immersion cooling in a compact-format circuit card environment, the apparatus comprising:
   a plurality of circuit cards, each circuit card including first and second longitudinally spaced circuit card subassemblies, each of the first and second circuit card subassemblies being surrounded in a longitudinal-lateral plane by a corresponding first or second perimeter frame, the first and second circuit card subassemblies being connected together by a longitudinally extending card connector, the first and second circuit card subassemblies having first and second operating temperatures, respectively, the first and second operating temperatures being different from one another;
   a first temperature tank collectively formed by at least a plurality of first perimeter frames arranged in a transversely extending stack, the first temperature tank substantially surrounding the plurality of first circuit card subassemblies, the first temperature tank selectively containing a first cooling fluid for convective circulation around the plurality of first circuit card subassemblies;
   a second temperature tank collectively formed by at least a plurality of second perimeter frames arranged in a transversely extending stack, the second temperature tank substantially surrounding the plurality of second circuit card subassemblies, the second temperature tank selectively containing a second cooling fluid for convective circulation around the plurality of second circuit card subassemblies;
   at least one first temperature cooling supply line being in selective fluid communication with the first temperature tank, the first temperature cooling supply line selectively introducing the first cooling fluid into the first temperature tank for at least partially inducing the first operating temperature;
   at least one second temperature cooling supply line being in selective fluid communication with the second temperature tank, the second temperature cooling supply line selectively introducing the second cooling fluid into the second temperature tank for at least partially inducing the second operating temperature;
   at least one first temperature cooling return manifold being in selective fluid communication with the first temperature tank, the first temperature cooling return manifold selectively removing the first cooling fluid from the first temperature tank for at least partially inducing the first operating temperature; and
   at least one second temperature cooling return manifold being in selective fluid communication with the second temperature tank, the second temperature cooling return manifold selectively removing the second cooling fluid from the second temperature tank for at least partially inducing the second operating temperature.

2. The apparatus of claim 1, wherein at least two adjacent first or second perimeter frames collectively forming a selected one of the first and second temperature tanks includes an indium gasket interposed transversely therebetween.

3. The apparatus of claim 1, wherein an indium gasket is interposed laterally between at least one of the first and second temperature tanks, and a corresponding one of the first and second temperature cooling supply lines and the first and second temperature cooling return manifolds.

4. The apparatus of claim 1, wherein each circuit card subassembly includes a plurality of IC chips extending transversely from a single backing substrate.

5. The apparatus of claim 1, wherein the card connector includes a flexible interconnect extending longitudinally between the first and second circuit card subassemblies of a selected circuit card.

6. The apparatus of claim 1, wherein each of the plurality of circuit cards is transversely positioned with respect to an adjacent circuit card.

7. The apparatus of claim 1, including a network interconnect board operatively coupled to a selected one of the first and second circuit card subassemblies, longitudinally opposite the other one of the first and second circuit card subassemblies.

8. The apparatus of claim 1, wherein a single first or second perimeter frame substantially surrounds, in a longitudinal-lateral plane, at least two corresponding first or second circuit card subassemblies.

9. The apparatus of claim 1, wherein at least a selected one of the first and second perimeter frames includes a mechanical/optical interface for signal-transmitting connection to a respective one of the first and second circuit card subassemblies.

10. The apparatus of claim 1, including a multi-layer insulation shield substantially surrounding at least one of the first and second temperature tanks on at least four of six orthogonal sides, the card connector extending completely through a wall of the multi-layer insulation shield.

11. The apparatus of claim 1, including:
   a first cooling fluid source in fluid supplying communication with the first temperature cooling supply line;
   a second cooling fluid source in fluid supplying communication with the second temperature cooling supply line;
   a first cooling fluid destination in fluid removing communication with the first temperature tank via a first temperature cooling return manifold of the first temperature tank; and
   a second cooling fluid destination in fluid removing communication with the second temperature tank via a second temperature cooling return manifold of the second temperature tank.

12. The apparatus of claim 11, including a plurality of manifold interfaces, each manifold interface being in fluid communication with a selected one of the first and second temperature tanks, each manifold interface being configured for selective fluid communication with a tank interior of the selected first or second temperature tank;
   wherein the first temperature cooling supply line is in fluid communication via the at least one manifold interface with the tank interior of the first temperature tank; and
   wherein the second temperature cooling supply line is in fluid communication via the at least one manifold interface with the tank interior of the second temperature tank.

13. The apparatus of claim 11, wherein each of the first and second temperature cooling supply lines is in bidirectional fluid communication with the corresponding first or second temperature tank via the corresponding manifold interface.

14. The apparatus of claim 12, wherein a laterally topmost edge of at least one of the first and second perimeter frames is bent such that the manifold interface is at a high point along that laterally topmost edge.

15. A method of providing immersion cooling in a compact-format circuit card environment, the method comprising:
providing an apparatus including
a plurality of circuit cards, each circuit card including first and second longitudinally spaced circuit card subassemblies, each of the first and second circuit card subassemblies being surrounded in a longitudinal-lateral plane by a corresponding first or second perimeter frame, the first and second circuit card subassemblies being connected together by a longitudinally extending card connector, the first and second circuit card subassemblies having first and second operating temperatures, respectively, the first and second operating temperatures being different from one another,
a first temperature tank collectively formed by at least a plurality of first perimeter frames arranged in a transversely extending stack, the first temperature tank substantially surrounding the plurality of first circuit card subassemblies,
a second temperature tank collectively formed by at least a plurality of second perimeter frames arranged in a transversely extending stack, the second temperature tank substantially surrounding the plurality of second circuit card subassemblies,
at least one first temperature cooling supply line being in selective fluid communication with the first temperature tank, and
at least one second temperature cooling supply line being in selective fluid communication with the second temperature tank;
at least partially exposing the first circuit card subassemblies to the first operating temperature via placing at least one first temperature cooling supply line in selective fluid communication with an interior of the first temperature tank;
selectively introducing a first cooling fluid into, and selectively removing the first cooling fluid from, the first temperature tank;
convectively circulating the first cooling fluid around the plurality of first circuit card subassemblies within the first temperature tank to at least partially induce the first operating temperature;
at least partially exposing the second circuit card subassemblies to the second operating temperature via placing at least one second temperature cooling supply line in selective fluid communication with an interior of the second temperature tank;
selectively introducing a second cooling fluid into, and selectively removing the second cooling fluid from, the second temperature tank; and
convectively circulating the second cooling fluid around the plurality of second circuit card subassemblies within the second temperature tank to at least partially induce the second operating temperature.

16. The method of claim 15, including:
providing the apparatus with a plurality of manifold interfaces, with each manifold interface being in fluid communication with a selected one of the first and second temperature tanks, each manifold interface for selective fluid communication with a tank interior of the selected first or second temperature tank;
placing a first temperature cooling supply line in fluid communication via the at least one manifold interface with the tank interior of the first temperature tank;
placing a second temperature cooling supply line in fluid communication via the at least one manifold interface with the tank interior of the second temperature tank;
placing a first cooling fluid source in fluid supplying communication with the first temperature cooling supply line;
placing a second cooling fluid source in fluid supplying communication with the second temperature cooling supply line;
placing a first cooling fluid destination in fluid removing communication with the first temperature tank via a first temperature cooling return manifold of the first temperature tank; and
placing a second cooling fluid destination in fluid removing communication with the second temperature tank via a second temperature cooling return manifold of the second temperature tank.

17. The method of claim 16, including placing each of the first and second temperature cooling supply lines in bidirectional fluid communication with a corresponding first or second temperature tank via a manifold interface.

18. The method of claim 16, including:
supporting and at least partially enclosing at least one apparatus, the first and second cooling fluid sources, and the first and second cooling fluid destinations within a cabinet; and
deploying the cabinet as a standard-dimensioned data center server rack.

19. The method of claim 16, including:
supporting and at least partially enclosing at least one apparatus, the first and second cooling fluid sources, and the first and second cooling fluid destinations within a transport container; and
deploying the transport container to a location for temporary data processing capability augmentation.

20. The method of claim 15, including operatively coupling a network interconnect board to a selected one of the first and second circuit card subassemblies, longitudinally opposite the other one of the first and second circuit card subassemblies.

21. The method of claim 15, including
providing a flexible interconnect type card connector; and
extending the flexible interconnect longitudinally between the first and second circuit card subassemblies of a selected circuit card.

22. The method of claim 21, including
substantially surrounding at least one of the first and second temperature tanks on at least four of six orthogonal sides with a multi-layer insulation shield, and
extending the flexible interconnect completely through a wall of the multi-layer insulation shield.

23. A system for providing immersion cooling in a compact-format circuit card environment, the system comprising:
an apparatus including
a plurality of circuit cards, each circuit card including first and second longitudinally spaced circuit card subassemblies, each of the first and second circuit card subassemblies being surrounded in a longitudinal-lateral plane by a corresponding first or second perimeter frame, the first and second circuit card subassemblies being connected together by a longitudinally extending card connector, the first and second circuit card subassemblies having first and second operating temperatures, respectively, the first and second operating temperatures being different from one another, a first temperature tank collectively formed by at least a plurality of first perimeter frames arranged in a transversely extending stack, the first temperature tank substantially surrounding the plurality of first circuit card subassemblies, the first temperature tank selectively containing a first cooling fluid for convective circulation around the plurality of first circuit card subassemblies, a second temperature tank collectively formed by at least a plurality of second perimeter frames arranged in a transversely extending stack, the second temperature tank substantially surrounding the plurality of second circuit card subassemblies, the second temperature tank selectively containing a second cooling fluid for convective circulation around the plurality of second circuit card subassemblies, at least one first temperature cooling supply line being in selective fluid communication with the first temperature tank, the first temperature cooling supply line selectively introducing the first cooling fluid into the first temperature tank for at least partially inducing the first operating temperature;

at least one second temperature cooling supply line being in selective fluid communication with the second temperature tank, the second temperature cooling supply line selectively introducing the second cooling fluid into the second temperature tank for at least partially inducing the second operating temperature;

at least one first temperature cooling return manifold being in selective fluid communication with the first temperature tank, the first temperature cooling return manifold selectively removing the first cooling fluid from the first temperature tank for at least partially inducing the first operating temperature;

at least one second temperature cooling return manifold being in selective fluid communication with the second temperature tank, the second temperature cooling return manifold selectively removing the second cooling fluid from the second temperature tank for at least partially inducing the second operating temperature;

a first cooling fluid source in fluid supplying communication with the first temperature tank via the first temperature cooling supply line;

a second cooling fluid source in fluid supplying communication with the second temperature tank via the second temperature cooling supply line;

a first cooling fluid destination in fluid removing communication with the first temperature tank via the first temperature cooling return manifold;

a second cooling fluid destination in fluid removing communication with the second temperature tank via the second temperature cooling return manifold; and a cabinet supporting and at least partially enclosing the apparatus, the first and second cooling fluid sources, and the first and second cooling fluid destinations.

24. The system of claim 23, wherein the cabinet includes a supporting structure including at least two support rods, wherein each of the first and second temperature tanks includes at least one mounting tabs configured to hold the corresponding first and second temperature tank laterally spaced from the support rods, with each mounting tab contacting the support rod at a plurality of points along the cross section of the support rod, to prevent full surface contact between the mounting tab and support rod and thus avoid creating an unwanted thermal path therebetween.

* * * * *